United States Patent [19]
Williams et al.

[11] Patent Number: 5,818,084
[45] Date of Patent: Oct. 6, 1998

[54] PSEUDO-SCHOTTKY DIODE

[75] Inventors: Richard K. Williams, Cupertino; Robert Blattner, Sunnyvale, both of Calif.

[73] Assignee: Siliconix incorporated, Santa Clara, Calif.

[21] Appl. No.: 648,334

[22] Filed: May 15, 1996

[51] Int. Cl.[6] ................................................ H01L 29/78
[52] U.S. Cl. ........................ 257/329; 257/146; 257/328
[58] Field of Search .................................... 257/329, 330, 257/331, 332, 334, 134, 135, 143, 149, 401, 341, 146

[56] References Cited

U.S. PATENT DOCUMENTS 4,967,243 10/1990 Baliga et al. ............................ 357/23.4
5,304,802 4/1994 Kumagai ................................. 257/146

FOREIGN PATENT DOCUMENTS 0 675 543 10/1995 European Pat. Off. .
58-095856 6/1983 Japan .

*Primary Examiner*—Tom Thomas
*Assistant Examiner*—David B. Hardy
*Attorney, Agent, or Firm*—Skjerven, Morrill, MacPherson, Franklin & Friel LLP; David E. Steuber

[57] ABSTRACT

An N-channel MOSFET is fabricated with its source, body and gate connected together and biased at a positive voltage with respect to its drain. The resulting two-terminal device functions generally in the manner of a diode but has a significantly lower turn-on voltage than a conventional PN diode. The device is therefore referred to as a "pseudo-Schottky diode". Pseudo-Schottky diodes have numerous uses, but they are particularly useful when connected to shunt current from a conventional PN diode or MOSFET and thereby prevent such conditions as snapback and latchup which can result from the storage of minority carriers in a forward-biased PN junction. Also, because the pseudo-Schottky diode is a majority carrier device, the diode recovery time, amount of stored charge, and peak reverse current are much lower than in a conventional PN diode.

14 Claims, 32 Drawing Sheets

THRESHOLD CONNECTED

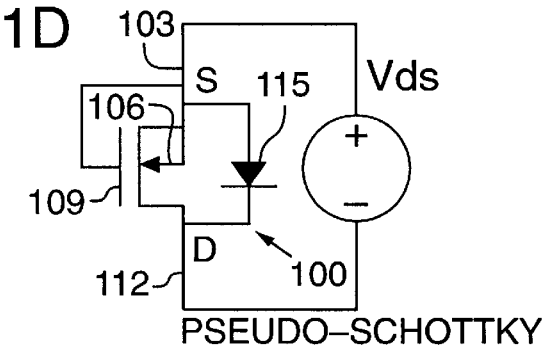
FIG. 1D PSEUDO-SCHOTTKY
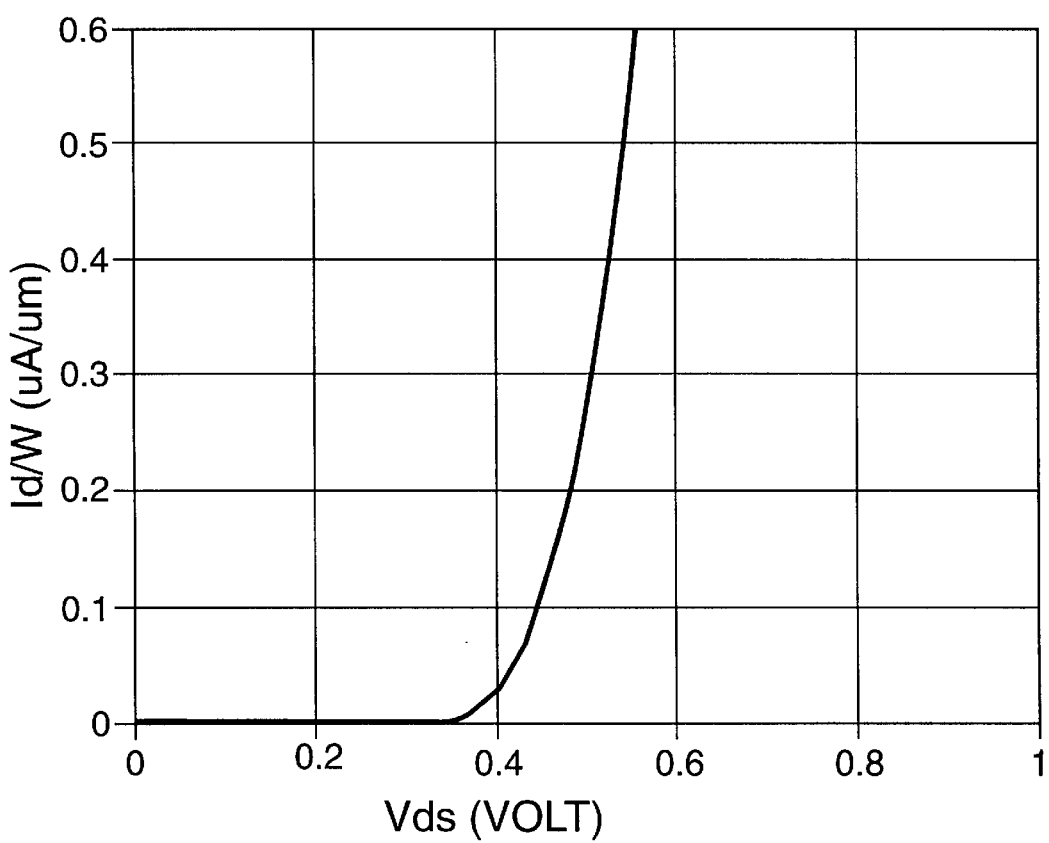
FIG. 1H

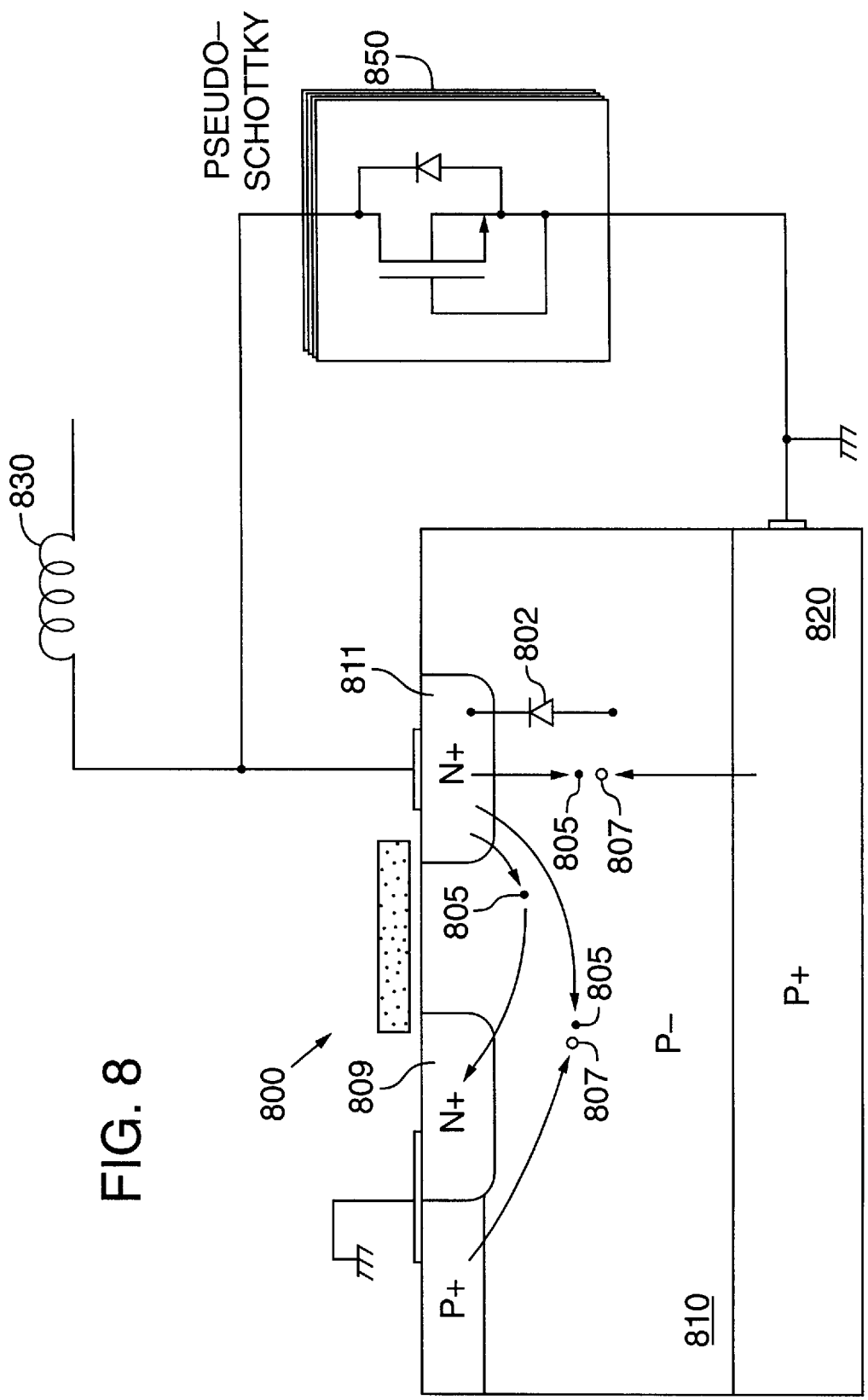

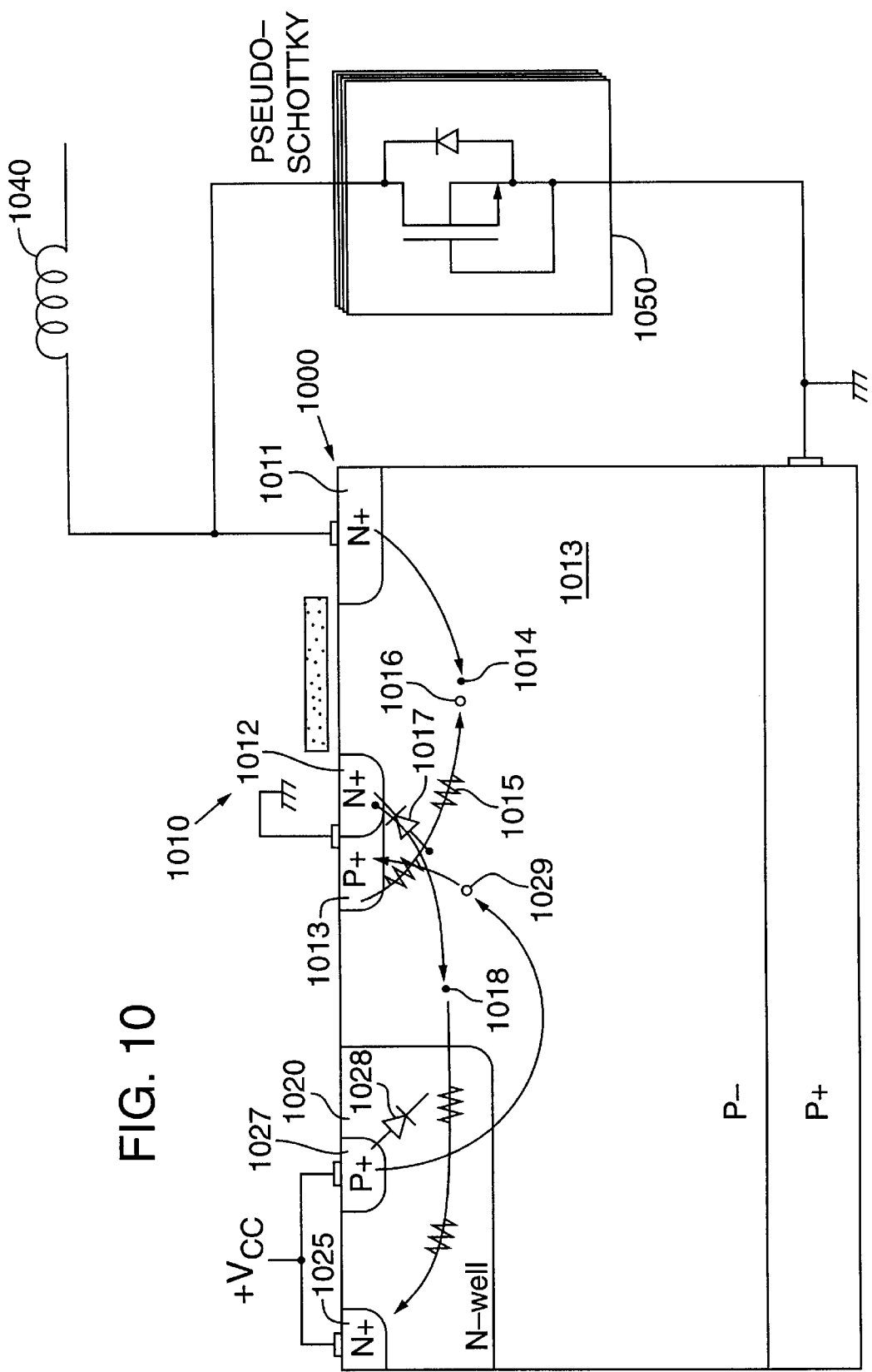

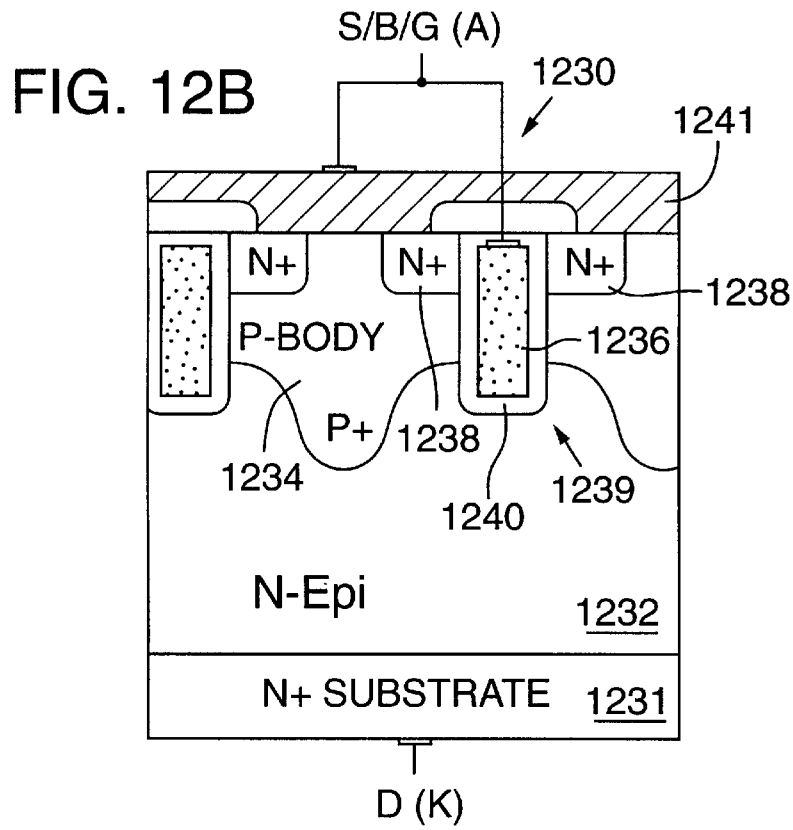
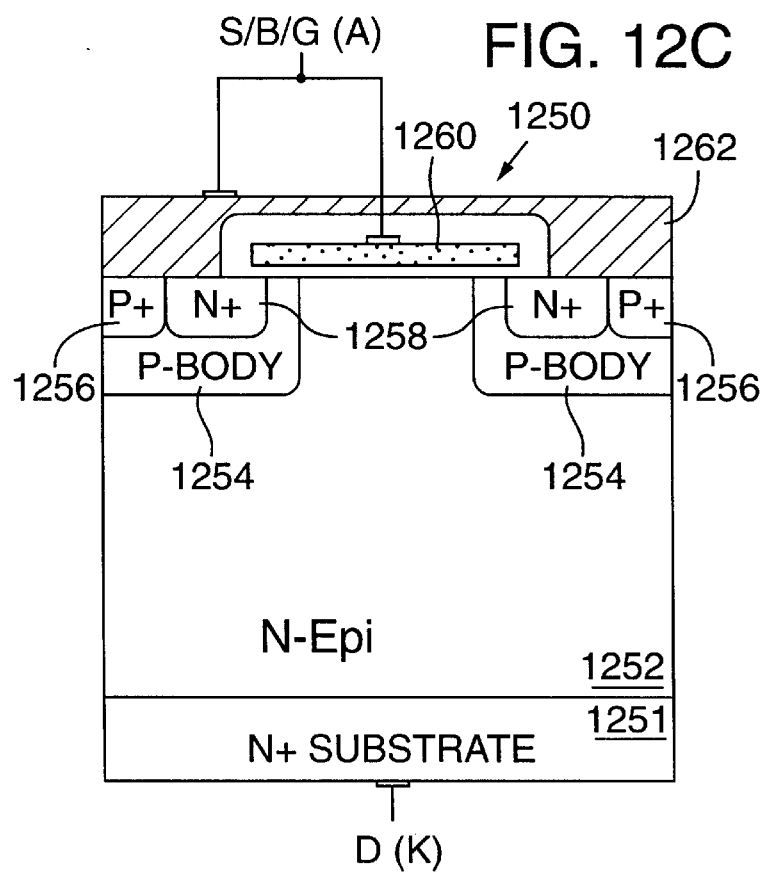

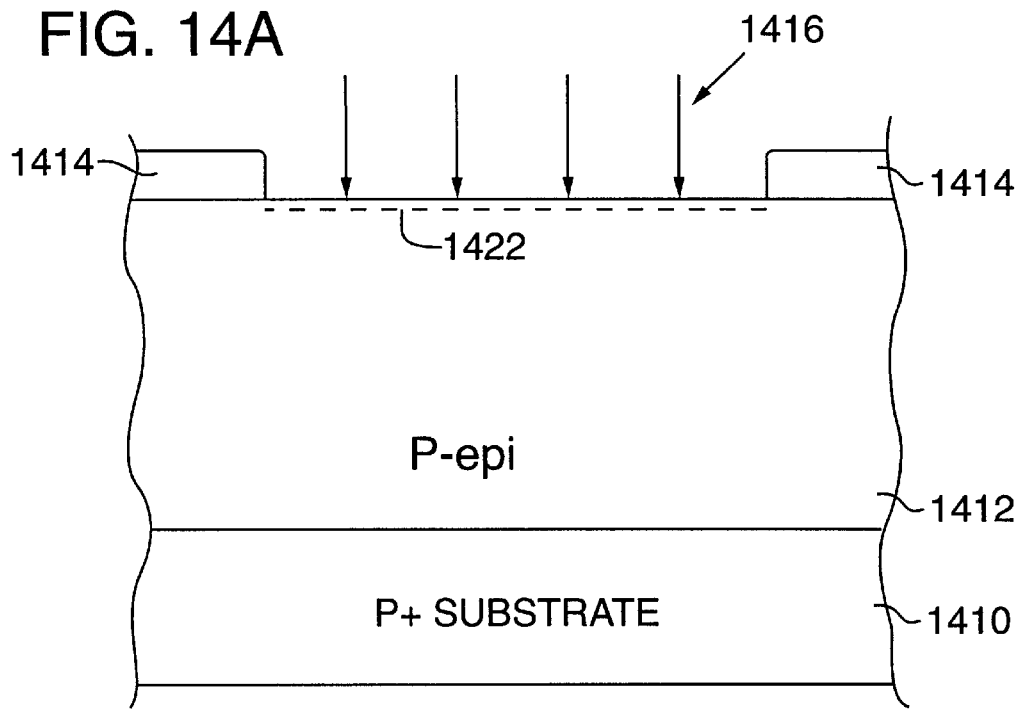
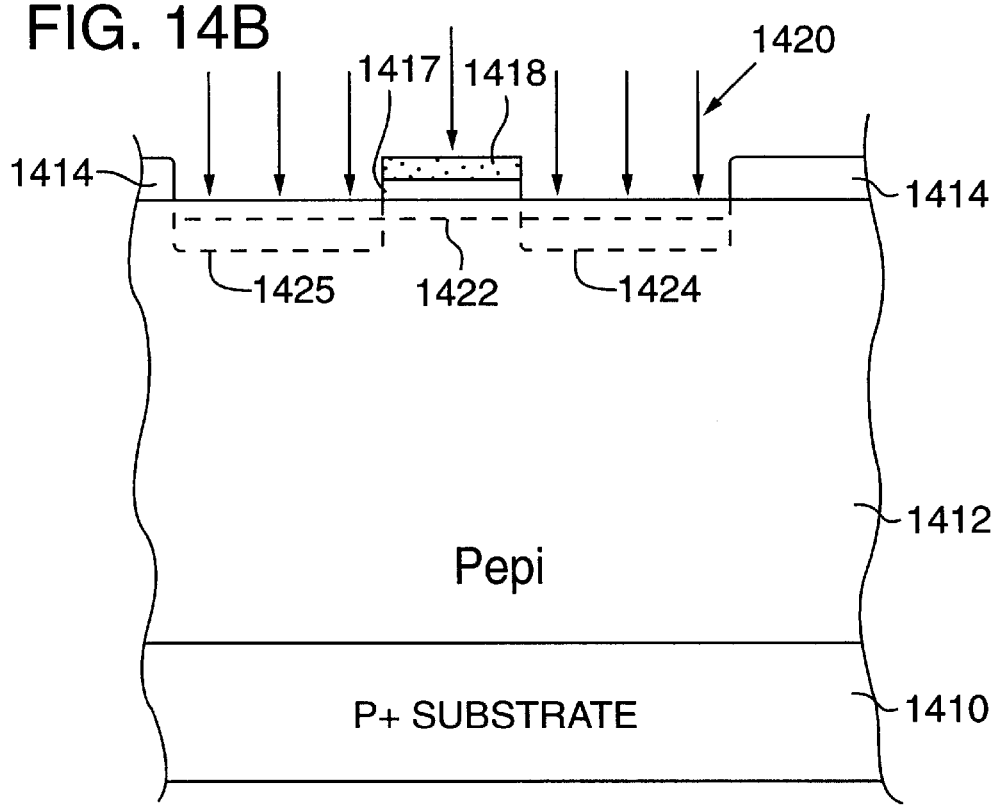

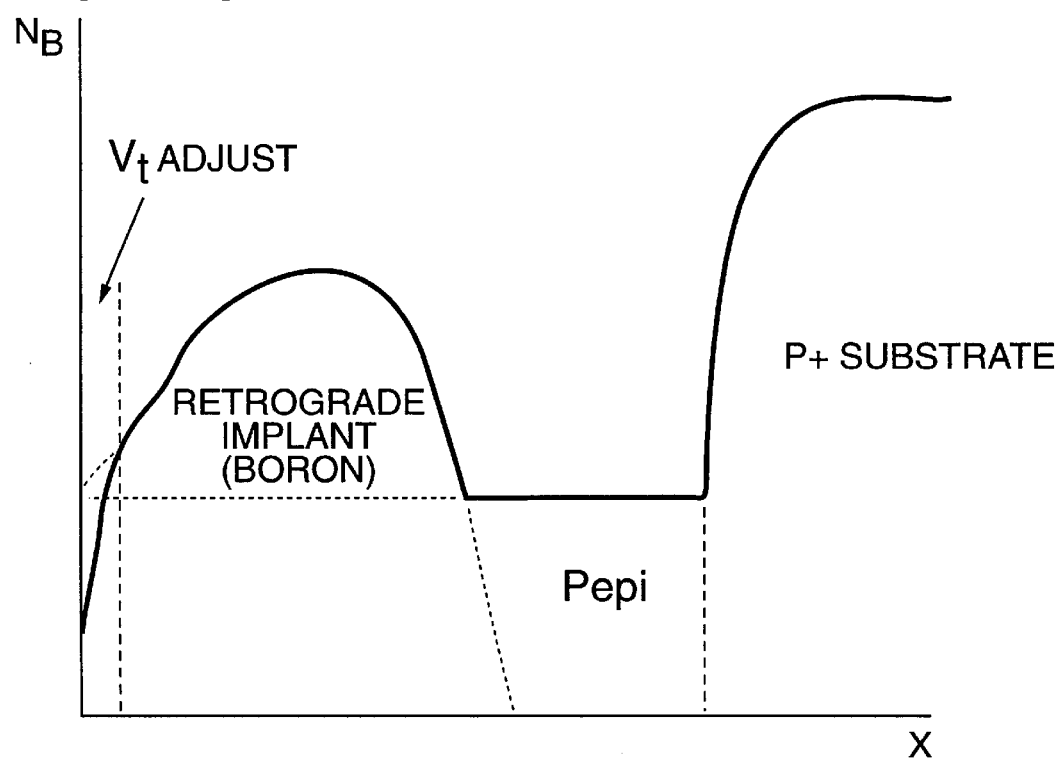

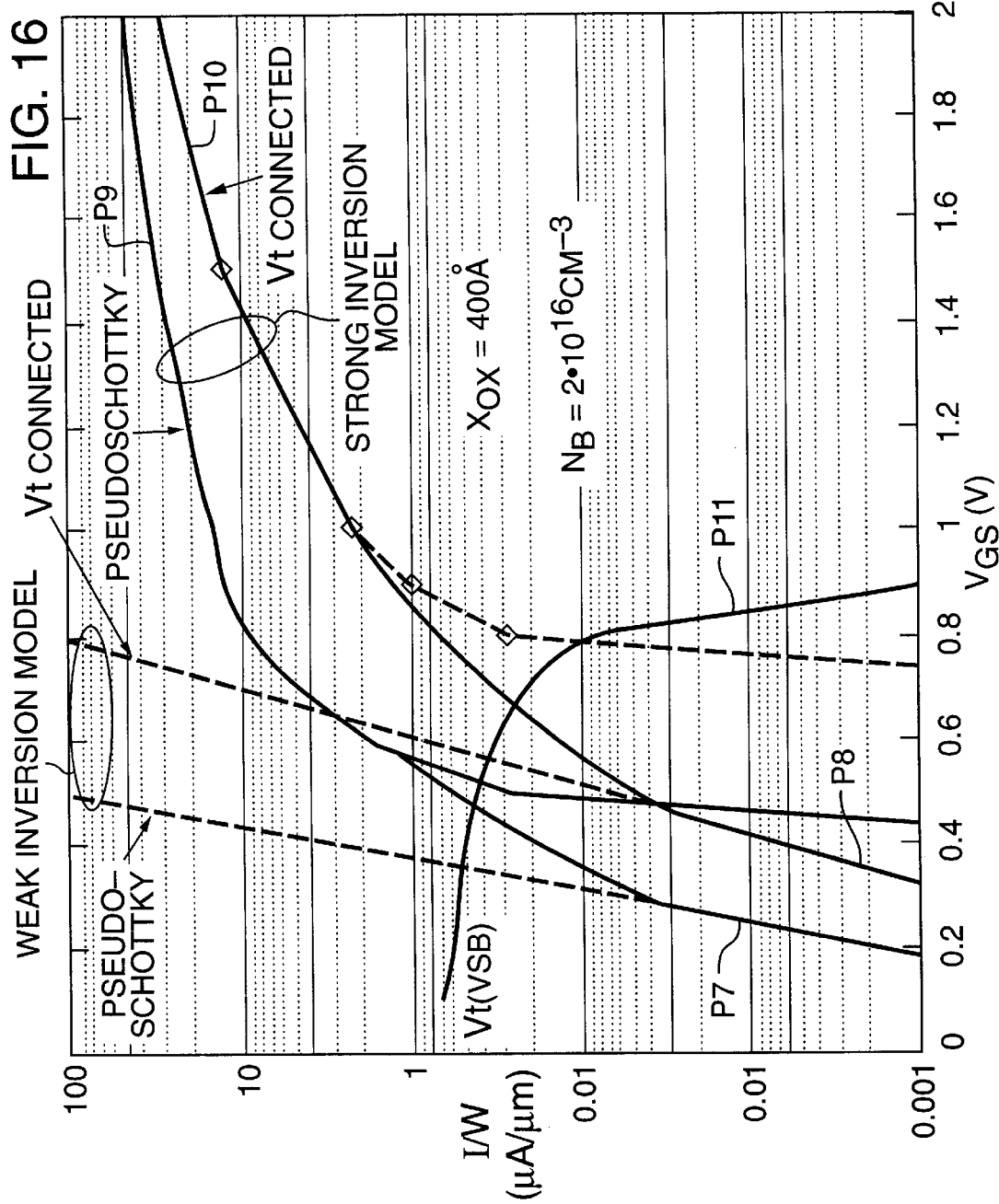

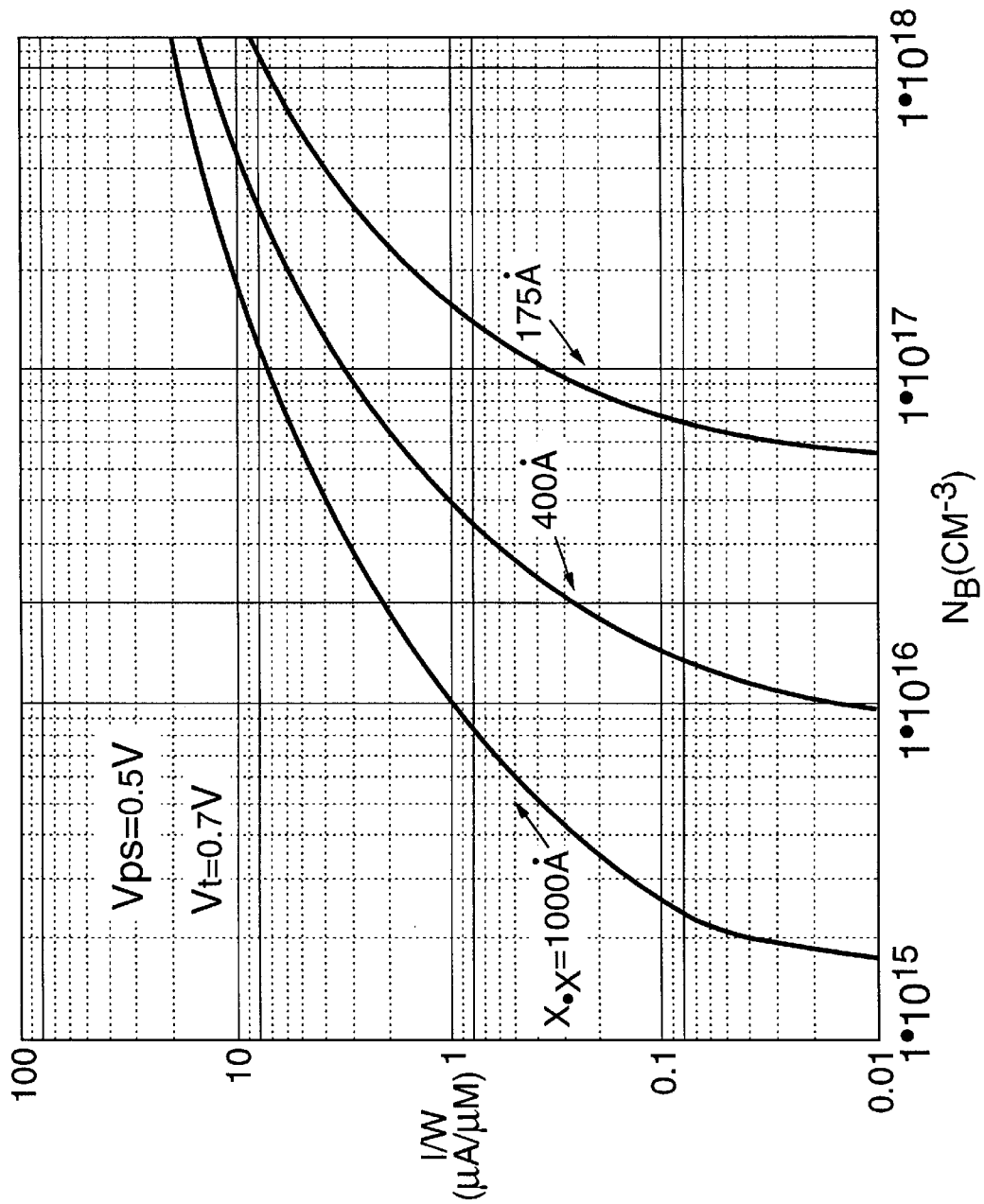

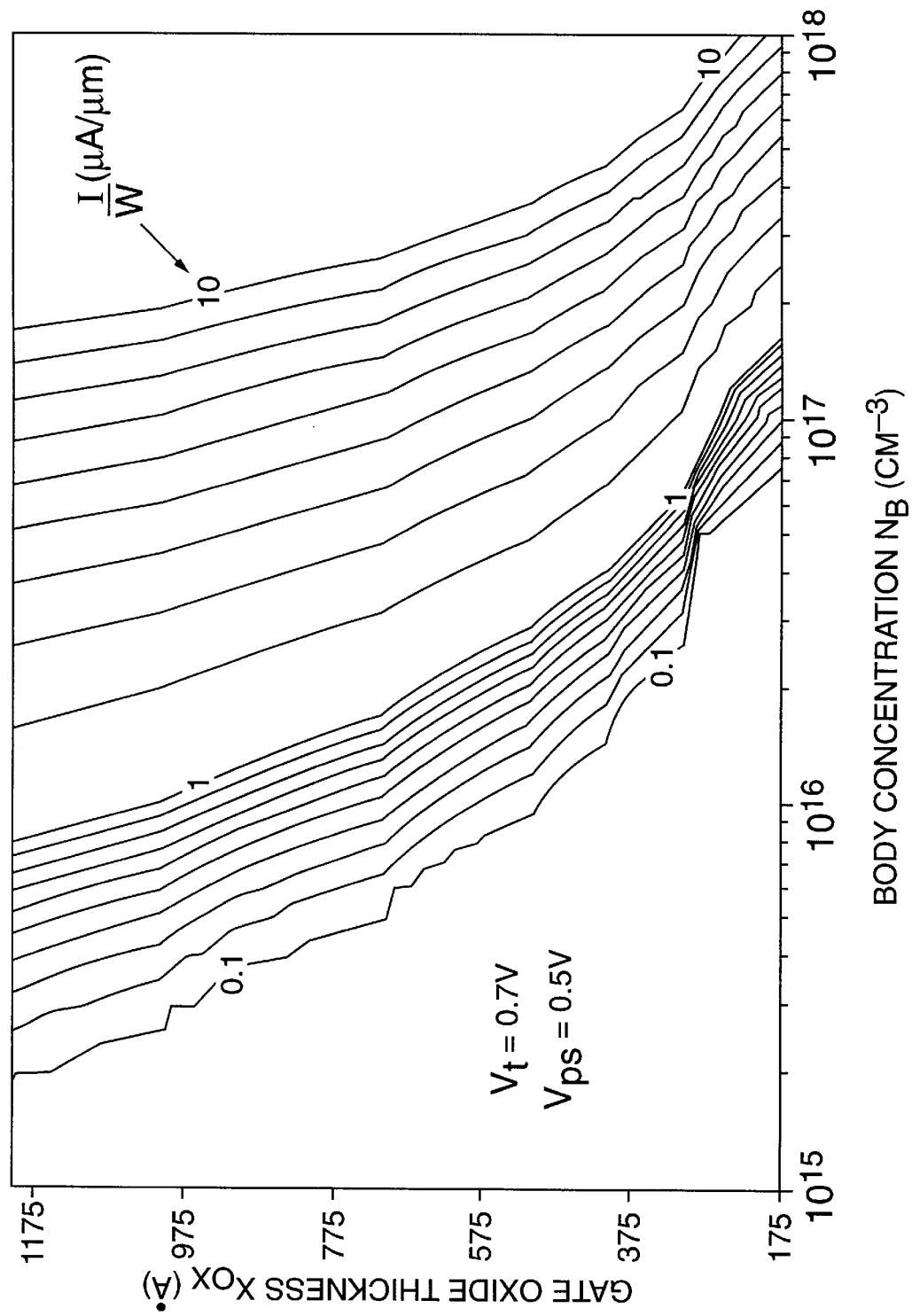

PSEUDO-SCHOTTKY DIODE

CROSS REFERENCE TO RELATED APPLICATIONS

This application is related to application Ser. No. 08/648,266 and application Ser. No. 08/649,747 now U.S. Pat. No. 5,689,144, issued on Nov. 18, 1997, each of which is being filed concurrently herewith and is incorporated herein by reference in its entirety.

FIELD OF THE INVENTION

This invention relates to voltage clamping devices and in particular to restricting current flows in PN diodes and MOS devices.

BACKGROUND OF THE INVENTION

A PN diode, when forward biased, is a minority carrier device and, as such, has a long recovery time compared to majority carrier devices. In many instances a PN diode is reverse-biased under normal operation but can become temporarily forward-biased due to transients in the circuit. During the time the PN diode is forward-biased, minority carriers are stored in the PN diode. In the event that the PN diode once again becomes reverse-biased, the stored minority carriers increase the reverse recovery time of the PN diode (i.e., the time it takes a forward-biased diode to block a voltage applied in the reverse direction). Furthermore, once the minority carriers are removed under reverse-bias, a rapid voltage transient (i.e., large dv/dt) will occur, and voltage spikes beyond the supply voltages may also occur.

Since an parasitic PN diode (sometimes referred to as an "antiparallel" diode) is inherent in any MOSFET with a source-body short, the performance of any MOSFET can be degraded by the minority carriers of the PN diode. During Quadrant I operation (where the source terminal is connected to a lower voltage than the drain terminal), the parasitic diode is reverse-biased and will conduct no current. However if the MOSFET should enter Quadrant III operation (where the source terminal is connected to a higher voltage than the drain terminal) the parasitic diode will become forward-biased and will conduct a current with minority carriers. (Note. Unless otherwise specified herein, in MOSFETs where the body is shorted to a drain/source terminal, the shorted terminal will be referred to as the "source" and the non-shorted terminal will be referred to as the "drain". In instances where the terms source and drain relate to their electrical function rather than their structure, the term "electrical source" or "electrical drain" will be used. For an N-channel MOSFET, the "electrical source" is more negative than the "electrical drain". For a P-channel MOSFET, the reverse is true.)

Several problems can result from the current through the parasitic diode. One problem is caused because the parasitic diode during conduction will begin to store charge, in the form of minority carriers, within the MOSFET. When the MOSFET returns to Quadrant I operation, the stored charge must be absorbed by the drain-to-source current of the MOSFET. Thus the switching time during the on-off transition and any associated power loss of the MOSFET will be increased. Furthermore, at the instant all the stored charge is absorbed a rapid voltage transition (i.e. large dv/dt) may occur. The large dv/dt in turn can cause snapback problems in the MOSFET (a form of undesirable bipolar transistor action), or trigger a latchup condition in an integrated circuit, where control of the device is lost.

If the MOSFET is part of an integrated circuit (IC), the current flowing through the parasitic diode may cause injection of minority carriers into the substrate of the IC. These minority carriers can travel through the substrate and cause various problems, such as latchup or snapback, in other devices throughout the IC.

Furthermore, the current through the parasitic diode can introduce charges into the IC that become majority carriers in different regions of the IC. In this situation voltage drops will occur in the IC creating a "ground bounce" situation in the IC (i.e., spacially varying ground potentials), which can cause latchup problems.

To avoid the problems caused by the parasitic diode of a MOSFET, the current which would pass through the parasitic diode of the MOSFET during Quadrant III operation can be shunted away from the parasitic diode by placing a shunting device in parallel with the diode. Moreover, a shunting device can also be used in parallel with any PN diode in order to prevent the problems caused by the minority carriers of a PN diode. Ideally, the shunting device should conduct no current when the PN diode is reverse-biased and turn on at a lower voltage than the PN diode when the PN diode is forward-biased. Due to the physical properties of silicon, silicon PN diodes have a turn-on voltage of 0.6 to 0.8 V. Within this range, a higher forward-bias voltage corresponds to higher current densities and more stored minority carrier charge. Therefore, the shunting device should have a turn-on voltage less than 0.6 V. Furthermore, for the parasitic diode of a MOSFET, the shunting device should also have a low recovery time so that the turn-off time of the MOSFET will not be degraded by the shunting device.

It is known in the art to use a Schottky diode as the shunting device. A Schottky diode is characterized by a low turn-on voltage (typically 0.2 to 0.3 volts), fast turn-off, and non-conductance when the Schottky diode is reverse-biased. Therefore, a Schottky diode can perform the functions of the shunting device.

However, to add Schottky diodes to an IC requires additional process steps. Specifically, to create a Schottky diode a metal-silicon barrier must be formed. In order to obtain the proper characteristics for the Schottky diode, the barrier metal will likely be different than the metal used in other process steps, such as metal ohmic contacts. These additional steps add cost and complexity to the IC.

Alternatively, discrete Schottky diodes can be connected in parallel with the MOSFET or PN diode of the IC in a multi-chip solution. However, in this type of connection there will exist various resistances, capacitances, and inductances within the connecting wires that may delay the Schottky diode's turn-on so that the parasitic or stand-alone PN diode will turn on before the Schottky diode. Furthermore, the use of discrete Schottky diodes is not ideal, since the clamping of the parasitic or stand-alone diode should be localized by placing the Schottky diode as close as possible to the parasitic or stand-alone diode.

Therefore, what is needed is a shunting device which can be manufactured in an IC without requiring additional process steps, and which has the properties of turn-on voltage lower than a silicon diode, a fast recovery time when switched from a forward-bias to reverse-bias condition, and non-conductance under reverse bias. Ideally, the shunting device could be merged into the power MOSFET itself without compromising the on-resistance or current density of the device.

SUMMARY OF THE INVENTION

This invention makes use of the "body effect" which occurs in a MOSFET when the PN junction between the body and the drain (electrical source) of the MOSFET is partially forward-biased. As a result of the body effect, the threshold voltage of the MOSFET is reduced, so that a relatively small voltage applied to the gate will cause a current to flow predominantly through the channel of the MOSFET, as compared to the parasitic diode that is formed at the body-drain junction. For example, with an N-channel MOSFET, if the body is given a small positive bias in relation to the drain (e.g., 0.05–0.6 V), the gate-to-source voltage $V_{gs}$ that is necessary to turn the channel of the MOSFET on is reduced. With a P-channel MOSFET, if the body is given a small negative bias in relation to the drain, the $V_{gs}$ required to turn the channel on is likewise reduced in an absolute sense (i.e., a less negative $V_{gs}$ is required).

This type of arrangement may be constructed in several ways. If the MOSFET is fabricated as a four-terminal device, the body is properly biased in relation to the drain, and the gate is independently controlled (in an NMOS device, the drain being the terminal which is biased below the source). Alternatively, the MOSFET may be fabricated as a three-terminal device, with the body and source tied together and the gate independently controlled. In the preferred embodiment, however, the MOSFET is fabricated as a two-terminal device, with the body, gate and source tied together. Regardless of which configuration is used, if the MOSFET is properly biased it will turn on at a voltage which is substantially below the voltage at which a conventional PN diode will conduct current in the positive direction (i.e., 0.6–0.8 V). The two-terminal embodiment thus behaves like a diode which has a turn-on-voltage (at reasonable current densities) which is lower than that of a normal diode, although its turn-on voltage is not necessarily as low as that of a Schottky diode. In recognition of these characteristics, the two-terminal device is referred to herein as a "pseudo-Schottky diode", a name which will also be recognized as describing the physics of the MOSFET operation under certain conditions which make it behave more like a true Schottky diode than like a variable resistor.

The performance of a pseudo-Schottky diode is improved to the extent that the body effect is maximized and the threshold voltage is minimized. The objective is to maximize the ratio of the channel current to the body-drain diode (PN junction) current, and to minimize the body-to-drain voltage. Generally speaking, the MOSFET should have a high gain ($G_m$), a low on-resistance ($R_{ds}$), and a low threshold voltage ($V_t$). As will become apparent, the term "low on-resistance" is used in a somewhat unconventional sense, since the pseudo-Schottky diode conducts at a condition where the surface of the channel may not be fully inverted.

Pseudo-Schottky (channel) conduction is significantly enhanced by designing the device to have a low threshold voltage, a thick gate oxide, a high body dopant concentration, a short channel length, and a large gate width per unit area. A threshold adjust ion implantation is typically required to offset the effect of those factors (e.g., high body doping and thick gate oxide) which tend to increase the threshold voltage. According to one aspect of this invention, in a lateral device the threshold adjust ion implantation is performed prior to the formation of the gate. According to another aspect of the invention, for devices which require large "root Dt" processes (D being the diffusivity of the dopant and t being time), the threshold adjust implantation is performed either through the gate oxide and gate (after any long, high-temperature furnace operation) or by introducing relatively immobile (slow diffusing) ions such as cesium into the gate oxide prior to the formation of the gate.

The pseudo-Schottky diode of this invention has numerous uses. For example, a pseudo-Schottky diode may be fabricated in parallel with other diodes and transistors in an integrated circuit (IC) chip. Since the pseudo-Schottky turns on at a lower voltage than a normal diode, it effectively clamps the other diodes in the forward direction. This limits charge storage and forward conduction in the other diodes, conditions which can lead to minority carrier injection, MOSFET snapback, and latchup of the IC chip.

The pseudo-Schottky diode is also useful in switching mode power converters, where it can be used in place of a normal MOSFET that serves as a synchronous rectifier, to reduce the power loss and stored charge in the "break-before-make" interval which occurs before the gate is pulled high (assuming an N-channel device) to turn the MOSFET fully on. By biasing the gate of the synchronous rectifier MOSFET to the source rather than ground, current flows through the channel of the MOSFET rather than through its intrinsic anti-parallel diode in the break-before-make interval. Since the voltage drop across the channel is substantially lower than the voltage drop across the anti-parallel diode, the IV power loss in the synchronous rectifier is reduced, and problems associated with stored charge in the PN diode are reduced or virtually eliminated.

In yet another application, a pair of pseudo-Schottky diodes can be used in place of the conventional bipolar transistor or MOSFET pair in a current mirror, thereby significantly reducing the voltage necessary to drive the current mirror.

BRIEF DESCRIPTION OF THE DRAWINGS

FIGS. 1A–1D illustrate circuit diagrams showing four possible ways of connecting a MOSFET as a two-terminal device.

FIGS. 1E–1H illustrate graphs showing the electrical characteristic of the configurations shown in FIGS. 1A–1D, respectively.

FIG. 8 illustrates a cross-sectional view of an IC showing the use of a pseudo-Schottky diode to prevent diode recovery snapback caused by injection of minority carriers by the parasitic diode in an N-channel MOSFET.

FIG. 10 illustrates a cross-sectional view of an IC showing the use of a pseudo-Schottky diode to prevent latchup of an IC caused by injection of minority carriers into the substrate by the parasitic diode.

FIGS. 12A–12C illustrate cross-sectional views showing three implementations of a pseudo-Schottky diode in integrated form.

FIGS. 14A–14E illustrate cross-sectional views showing a method of forming an pseudo-Schottky diode based on a lateral MOSFET.

FIG. 14G illustrates a graph showing an alternative dopant concentration profile for the pseudo-Schottky diode of FIG. 14E.

FIG. 16 illustrates a graph showing the log of the current (per unit gate width) versus the voltage between the terminals of a pseudo-Schottky diode as compared with those of a threshold-connected MOSFET (FIG. 1B).

FIG. 17 illustrates a graph showing the current density in a pseudo-Schottky diode as a function of the body doping concentration for three gate oxide thicknesses (with the threshold voltage and the voltage across the diode being held constant).

FIG. 18 illustrates a graph showing lines of equal current density in a pseudo-Schottky diode as a function of both body doping concentration and gate oxide thickness (with the threshold voltage and the voltage across the diode being held constant).

DESCRIPTION OF THE INVENTION

A pseudo-Schottky diode operates by making use of a phenomenon which is present in a low-threshold-voltage MOSFET operated with its body diode forward-biased and its gate enhanced. To understand this phenomenon, it is useful to consider the possible terminal configurations of a MOSFET.

FIGS. 1A–1D illustrate the four possible configurations of an N-channel MOSFET 100 as a two terminal device, and FIGS. 1E–1H show the associated IV graphs of the devices. As stated above, in order to avoid confusion in describing transistors where the body is shorted to a drain/source terminal of the MOSFET, the shorted terminal will be referred to as the source and the non-shorted terminal will be referred to as the drain.

Figure 1A:
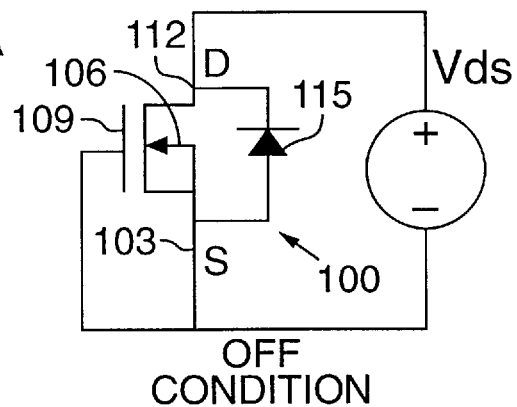
Figure 1E:
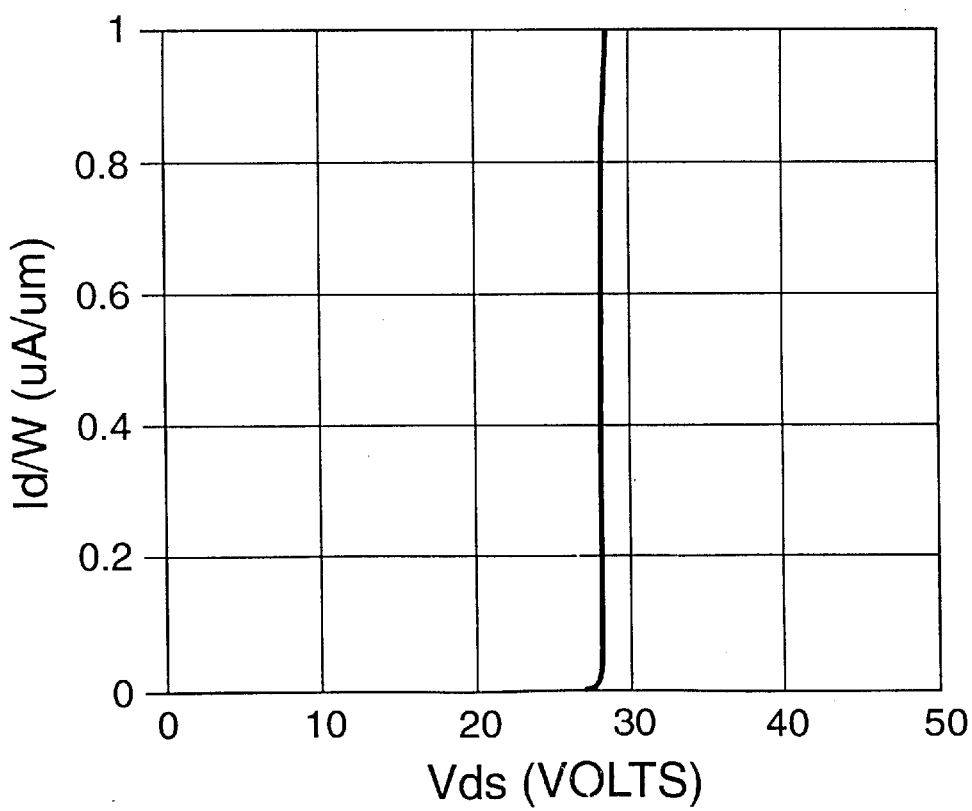

Thus, in MOSFET 100 shown in FIG. 1A the source terminal is labeled 103 and the drain terminal is labeled 112. Mosfet 100 also includes a body 106 and a gate 109. The reference numeral 115 designates the antiparallel diode which is inherent in MOSFET 100. As shown in FIG. 1A, the gate 109, the body 106 and the source terminal 103 are connected to negative voltage while the drain terminal 112 is connected to a positive voltage. Since the gate 109 is biased at the most negative potential, the channel of the MOSFET does not conduct. Furthermore, the parasitic diode 115 is reverse-biased and does not conduct. This configuration may be termed the "Off" configuration since under normal conditions no current flows through the MOSFET until the voltage reaches the breakdown voltage ($BV_{dss}$) of the antiparallel diode 115. The IV characteristic of MOSFET 100 connected as in FIG. 1A is shown in FIG. 1E, which shows a sharp current increase when the drain-to-source voltage $V_{ds}$ reaches the breakdown voltage $BV_{dss}$ of diode 115.

Figure 1B:
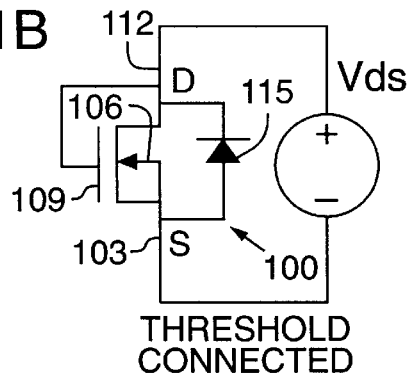
Figure 1F:
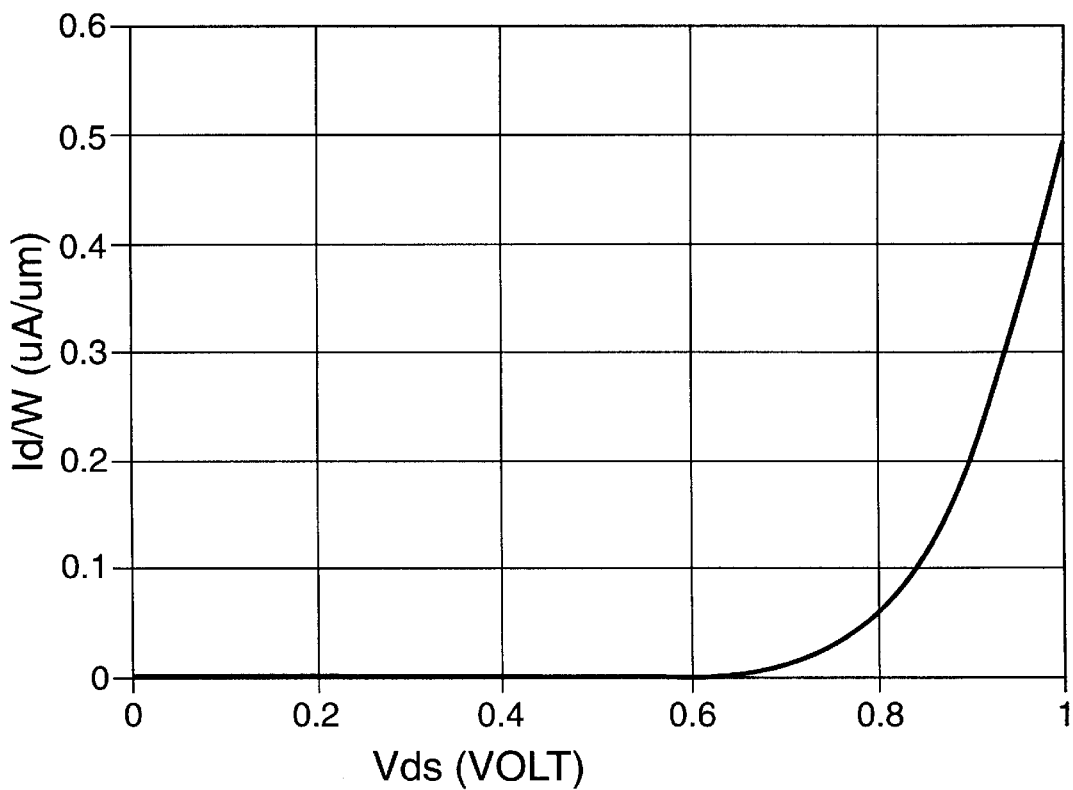

In the configuration shown in FIG. 1B, the gate 109 and the drain terminal 112 are tied to the positive voltage while the body 106 and the source terminal 103 are tied to the negative voltage. The parasitic diode 115 remains reverse-biased and nonconductive. However, since the gate 109 is tied to the positive power terminal, current will flow through the channel once the voltage reaches the threshold voltage $V_t$ of the MOSFET. This is designated the "Threshold-Connected" condition. The IV characteristic of MOSFET 100 connected as in FIG. 1B is shown in FIG. 1F, which shows a sharp current increase when $V_{ds}$ reaches approximately 0.8 V. While this connection gives a quick estimate of the MOSFET's threshold voltage, the true threshold voltage of the device must be determined by extrapolation methods that are described in numerous sources.

Figure 1C:
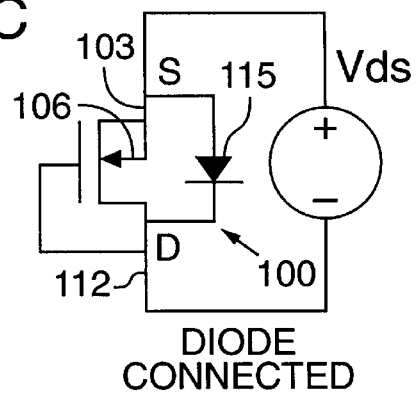
Figure 1G:
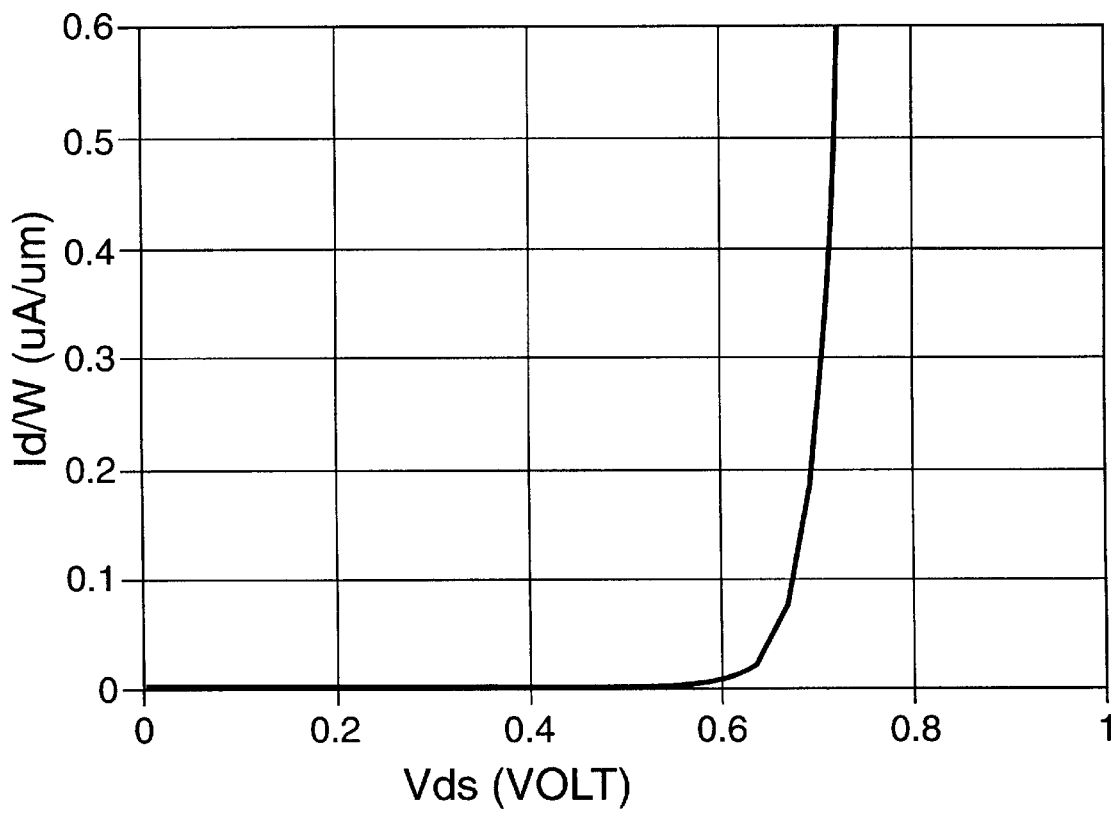

FIG. 1C illustrates the "Diode-Connected" condition. The source terminal 103 and body 106 are connected to the positive voltage while the gate 109 and drain 112 are connected to the negative voltage. Since the gate 109 is connected to the most negative potential the channel of MOSFET 100 will not conduct a current. However, the parasitic diode 115, which is forward-biased, will conduct at its turn-on voltage $V_{diode}$ (0.6–0.8 Volts). The IV characteristic of MOSFET 100 connected as in FIG. 1C is shown in FIG. 1G, which shows a sharp current increase when $V_{ds}$ reaches $V_{diode}$.

FIG. 1D illustrates the "pseudo-Schottky" diode configuration of this invention. The gate 109, source terminal 103, and body 106 are all connected to the positive voltage, while only the drain terminal 112 is connected to the negative voltage. In this configuration, for low current the MOS portion of the transistor will begin to conduct at the pseudo-Schottky voltage, designated $V_{PS}$ (0.3–0.5 V), which is significantly less than the normal diode turn on-voltage of 0.6 to 0.8 V or the threshold voltage of 0.8 V. The IV characteristic of MOSFET 100 connected as in FIG. 1D is shown in FIG. 1H, which shows a sharp current increase when $V_{ds}$ reaches $V_{PS}$.

Figure 2:
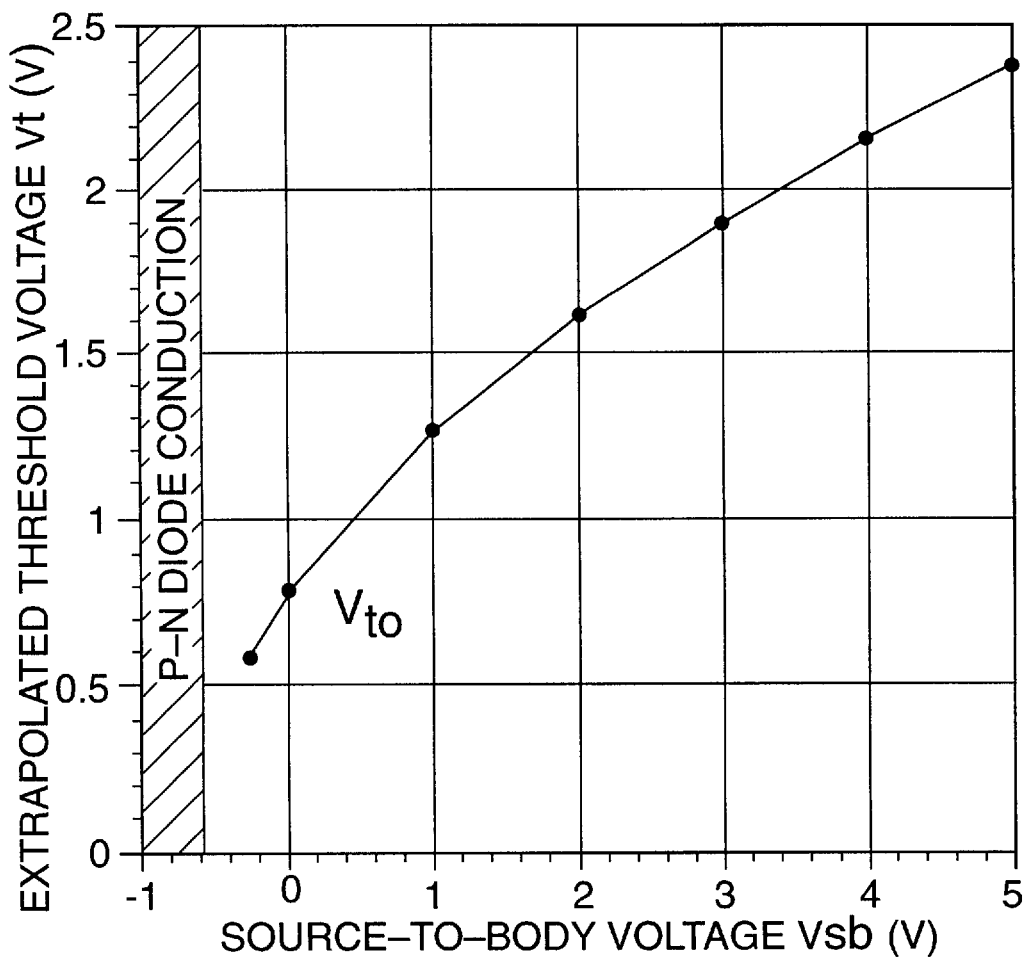
FIG. 2 illustrates a graph showing the threshold voltage ($V_t$) of a MOSFET as a function of the source-body voltage ($V_{sb}$) of the MOSFET.

FIG. 2 is a graph of the threshold voltage, $V_t$ of a four-terminal MOSFET (i.e., a MOSFET wherein the body is not shorted to either the source or the drain) as a function of the source-to-body voltage ($V_{sb}$) applied to the MOSFET. In this case the source is defined as the terminal connected to the negative potential while the drain is defined as the terminal connected to the positive potential. The threshold voltage when the customary source-body short is present ($V_{sb}=0$), is designated as $V_{t0}$. As can be seen from FIG. 2, $V_t$, the threshold voltage of the MOSFET, is lower when $V_{sb}$ is negative (i.e., when the body is biased above the source). The cause of this change of the threshold voltage with $V_{sb}$ is called the "body effect". The body effect is commonly assumed to be an increase in threshold voltage resulting from reverse-biasing the source-to-body junction, but in the case of the pseudo-Schottky diode, the partial forward-biasing of the source-to-body junction (negative $V_{sb}$) leads to a lowering of $V_t$, i.e., an "anti-body effect".

Figure 3:
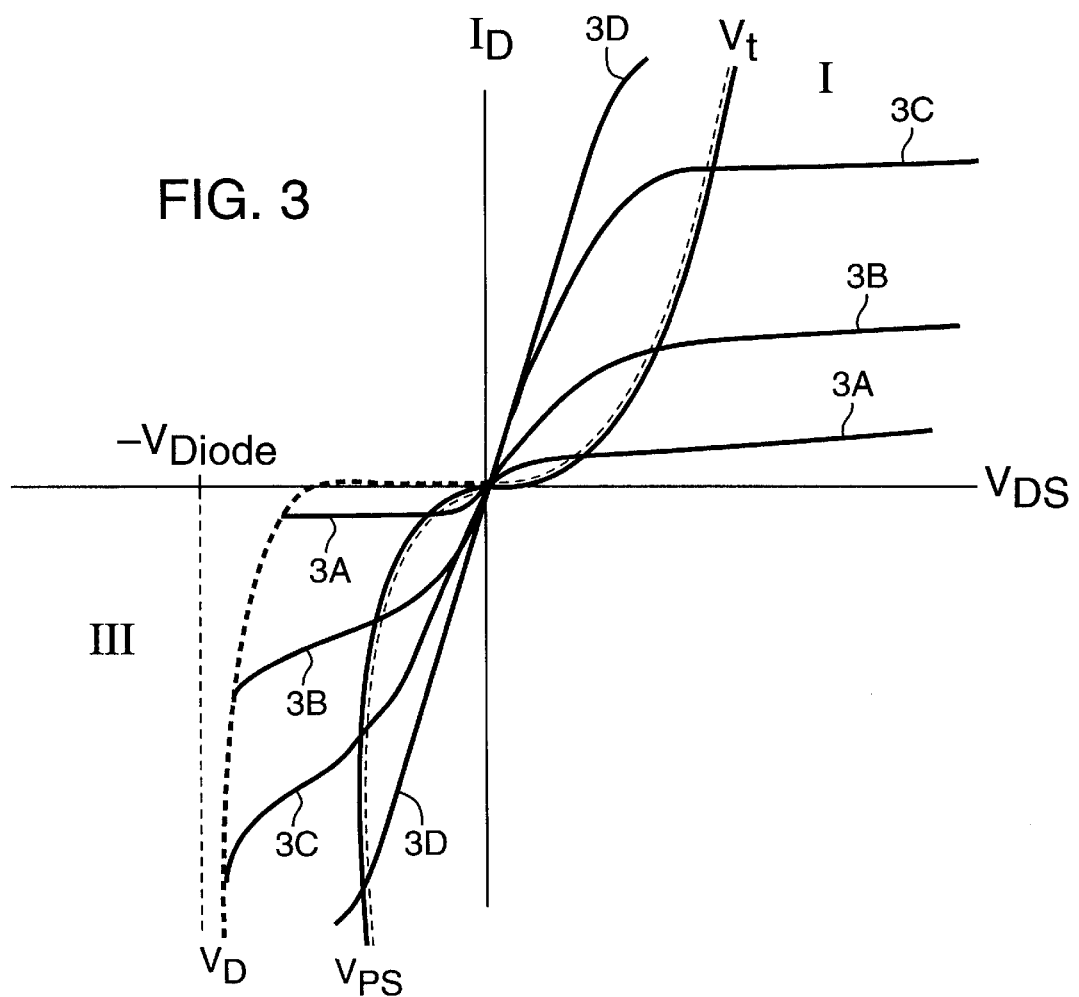
FIG. 3 illustrates a graph showing the drain current ($I_d$) as a function of the drain-source voltage ($V_{ds}$) at various levels of gate bias.

The curves designated 3A, 3B, 3C and 3D in FIG. 3 show the drain-to-source current $I_d$ of a MOSFET as a function of the drain-to-source voltage ($V_{ds}$) at various positive gate biases ($V_{gs}$). The source and body of the MOSFET are shorted together. In Quadrant I, where the drain is biased positive with respect to the source, the MOSFET acts essentially as a resistor until saturation is reached, and then the MOSFET acts as a constant current source. The curve designated $V_t$ shows $I_d$ as a function of $V_{ds}$ if the gate is connected to the drain ($V_{gs}=V_{ds}$), which is the "Threshold Connected" configuration shown in FIG. 1B. In Quadrant III, the source is biased positive with respect to the drain. The curves 3A–3D initially are symmetrical about the origin, but when $V_{ds}$ reaches $-V_{diode}$, the forward-biased parasitic diode turns on and thereafter the current through the diode overshadows the current through the channel of the MOSFET as $V_{ds}$ becomes more negative. Before $V_{ds}$ reaches $-V_{diode}$, however, the $I_d$ curves are affected by the body effect and the resultant lowering of the threshold voltage as shown in FIG. 2. This tends to increase the current through the channel before the parasitic diode begins to conduct. Most of this channel current is carried by majority carriers, which greatly diminishes the problems caused by minority carriers.

The curve designated $V_{PS}$ represents $I_d$ as a function of $V_{ds}$ when the source (the more positive terminal in Quadrant III) is tied to the gate. In this condition, the increasing gate bias relative to the drain (the most negative terminal in the MOSFET in Quadrant III), combines with the body effect which results from the increasing potential of the body relative to the drain, and which reduces the threshold voltage $V_t$ (see FIG. 2), to cause the MOSFET to begin conducting at a voltage in the range of 0.2 to 0.3 V lower.

Accordingly, curve $V_{PS}$ in FIG. 3 reveals that a MOSFET configured as shown in FIG. 1D behaves in the manner of a diode with a turn-on voltage which, while not normally as low as that of a true Schottky diode, is nonetheless significantly below the turn-on voltage of a conventional PN diode. The MOSFET of FIG. 1D is therefore referred to as a "pseudo-Schottky diode". The pseudo-Schottky diode has an anode at the terminal to which the body and gate of the MOSFET are tied and a cathode at the opposite terminal of the MOSFET.

Figure 4A:
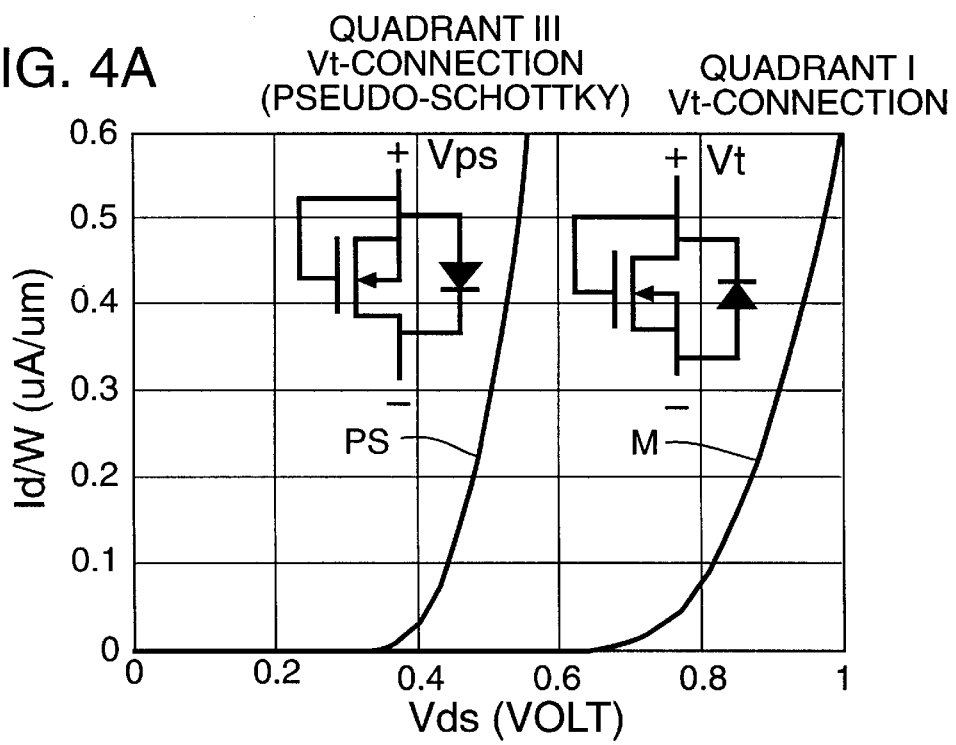
FIGS. 4A and 4B illustrate graphs which compare the IV characteristics of a pseudo-Schottky diode and a threshold connected MOSFET.
Figure 4B:
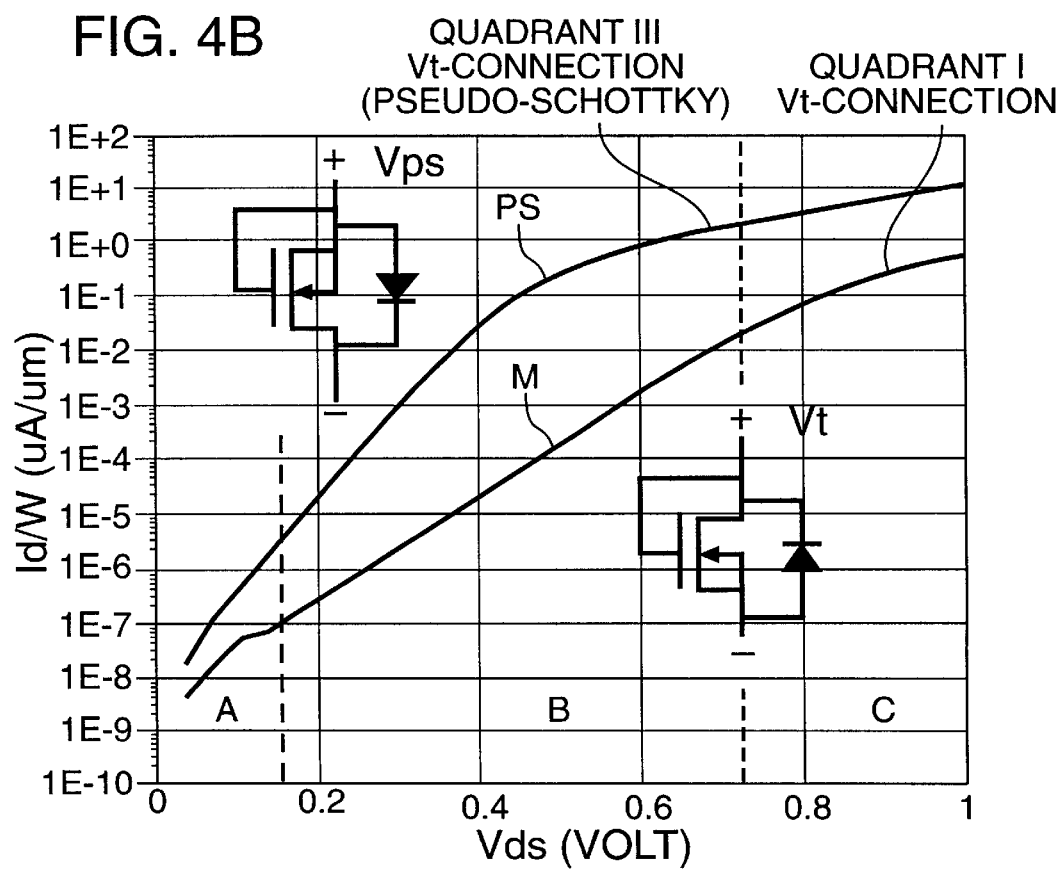

FIGS. 4A and 4B compare the drain-to-source current $I_d$ of a MOSFET (in $\mu A/\mu m$ of channel width) in Quadrant I operation versus the $I_d$ of a pseudo-Schottky diode (i.e., a device which exhibits the pseudo-Schottky effect) in Quadrant III operation. The curve designated PS relates to the pseudo-Schottky diode, and the curve designated M relates to the MOSFET. In both cases, the gate of the MOSFET is tied to the more positive terminal of the MOSFET. FIG. 4A shows that due to the lower turn-on voltage of the pseudo-Schottky diode, the IV curve of the pseudo-Schottky diode is shifted towards the origin. FIG. 4B plots the log of $I_d$ to afford a better comparison of the currents, particularly in the subthreshold region of $V_{ds}$. In section A, only leakage current is passing through both the pseudo-Schottky diode and the MOSFET, and therefore the currents are approximately equal. In section B of the graph, the pseudo-Schottky diode has turned on; therefore, the pseudo-Schottky current is much larger than the MOSFET current. In section C, the MOSFET turns on and the body effect disappears so that the currents are once again equal. It is noteworthy that $I_d$ is several orders of magnitude higher in the pseudo-Schottky diode than in the MOSFET when $V_{ds}$ is in the range 0.2–0.6 V.

Figure 5A:
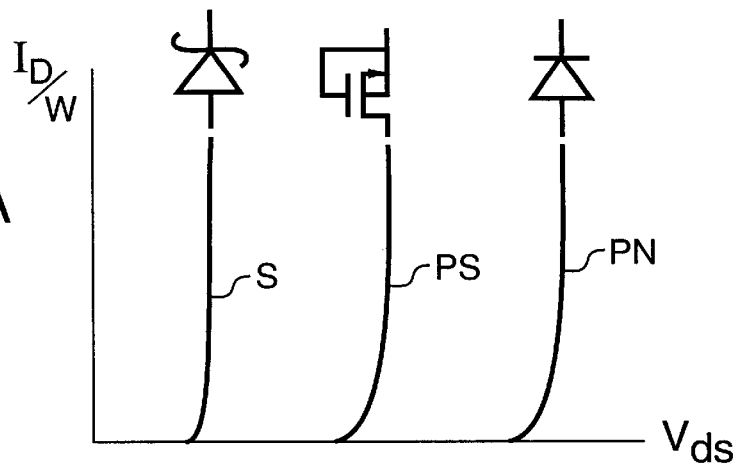
FIGS. 5A and 5B illustrate graphs which compare the IV characteristics of the a Schottky diode, a pseudo-Schottky diode, and an ideal PN diode.
Figure 5B:
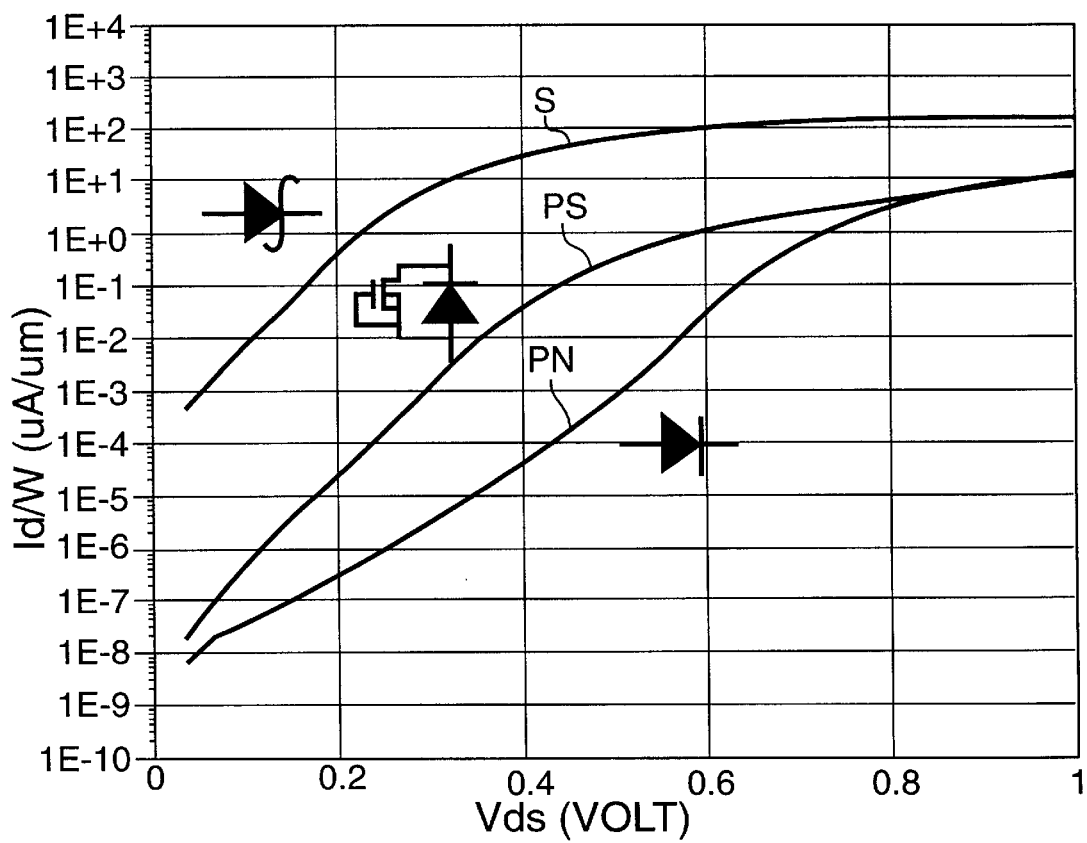

FIGS. 5A and 5B compare the IV characteristics of a Schottky diode (curve S), a pseudo-Schottky diode (curve PS), and a PN diode (curve PN). FIG. 5A plots $I_d$ and FIG. 5B plots log $I_d$. A parasitic PN diode in a MOSFET will exhibit similar characteristics to the PN diode. As shown in FIG. 5B, for voltages between the turn-on of the pseudo-Schottky diode and the turn-on of the PN diode (e.g., in the range 0.3–0.5 V), the current through the pseudo-Schottky diode can be over 100 times greater than that of the PN diode. Therefore, for these voltages the pseudo-Schottky diode provides a very effective shunting device for a PN diode.

Figure 6:
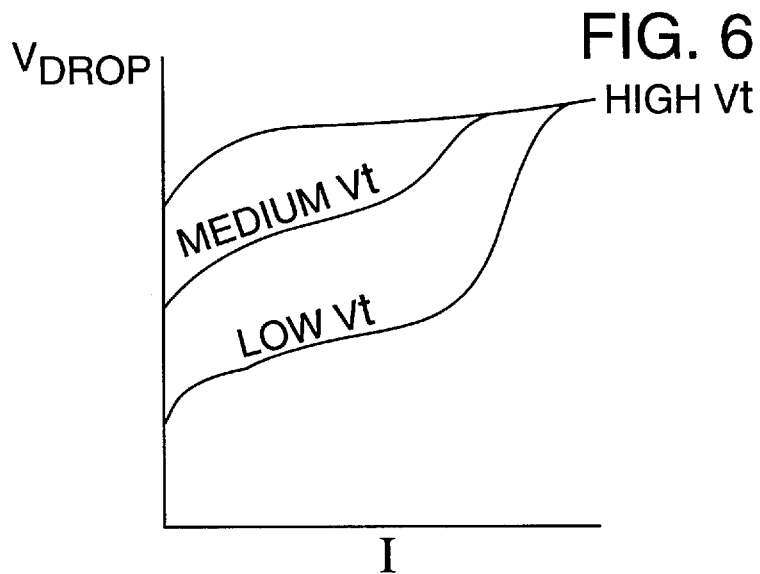
FIG. 6 illustrates a graph showing the voltage drop of a pseudo-Schottky diode under varying $V_t$ conditions.

FIG. 6 shows the voltage drop across a pseudo-Schottky diode ($V_{DROP}$) as a function of the current I for several threshold voltages $V_t$ of the MOSFET, where the threshold voltage is varied but the body effect is still pronounced. If a MOSFET has a high $V_t$ the body effect will be unable to lower the threshold enough for any significant conduction through the channel before the MOSFET's parasitic diode begins to conduct. For a low $V_t$ the body effect will lower the threshold of the MOSFET below the turn on voltage of the parasitic diode so that channel conduction will occur before the parasitic diode turns on. For medium $V_t$ channel conduction will occur to a lesser extent. The lower the threshold voltage, the higher the current density before the PN diode conduction overtakes the pseudo-Schottky (channel) conduction.

Figure 7A:
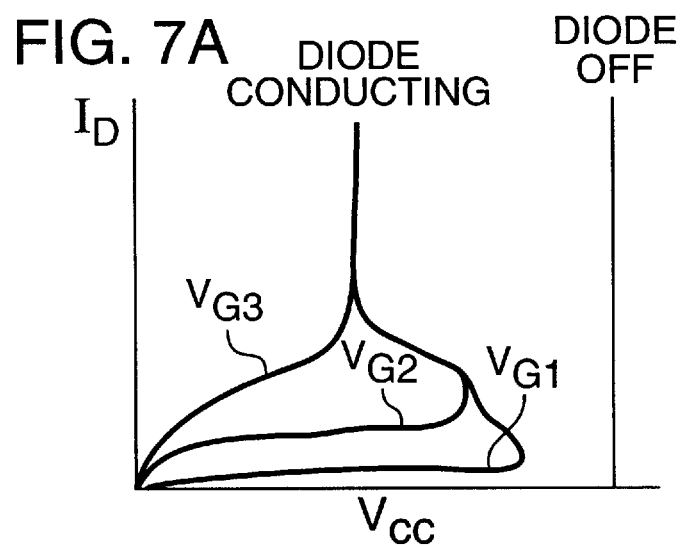
FIG. 7A illustrates a graph of a family of curves showing the snapback problem caused by the parasitic diode of a MOSFET.

FIG. 7A shows the IV characteristic of a MOSFET suffering from a snapback condition. $V_{G1}$, $V_{G2}$ and $V_{G3}$ represent different levels of gate drive voltage. During a snapback a voltage drop occurs in the MOSFET which forward biases the source to body junction when the drain is at a high positive potential. The parasitic bipolar transistor of the MOSFET begins to conduct at a lower voltage than breakdown voltage of the MOSFET. An example of this condition will be discussed below. At relatively low values of drain current, each of the three curves in FIG. 7A represents a normal MOSFET IV characteristic. Snapback occurs, however, where the device enters a region of negative resistance as the bipolar transistor turns on, and thereafter the current increases dramatically. The shapes of the curves can vary in the transitional region where the curves merge.

Figure 7B:
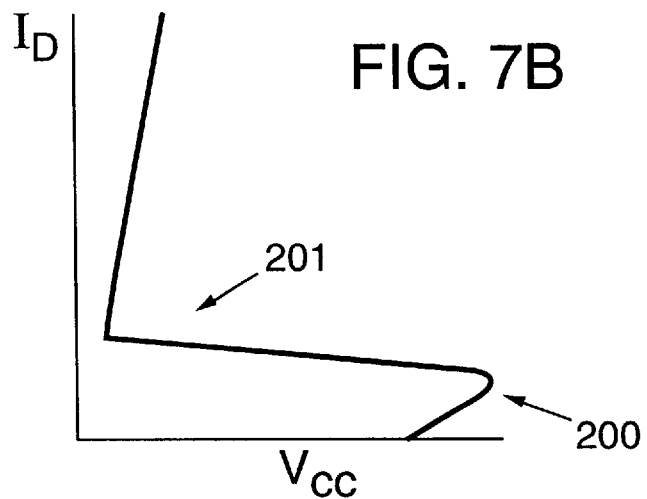
FIG. 7B illustrates a graph which shows the CMOS latchup problem caused by the parasitic diode of a MOSFET.

FIG. 7B shows the IV characteristic of an integrated circuit suffering from latchup. When the current reaches a certain point (designated 200 in FIG. 7B), the MOSFET will latch up and begin to conduct a sizeable current with almost no voltage drop (represented as region 201 in FIG. 7B). Even if the device survives the latchup current, the only way to restore normal operation is to momentarily remove the power from the device.

FIG. 8 illustrates the use of a pseudo-Schottky diode to avoid a snapback condition. An N-channel MOSFET 800, shown in cross-section, is connected in a circuit which includes an inductor 830 connected to a drain 811 of MOSFET 800. Inductor 830 represents any inductance that is present in the circuit. MOSFET 800 includes an N+ source 809, which is shorted to a P-epitaxial layer 810 and a P+ substrate 820, and drain 811. P-epitaxial layer 810 and a P+ substrate 820 together form the body of MOSFET 800. When a negative voltage spike from inductor 830 drives drain 811 below ground, the parasitic diode 802 becomes forward-biased and injects minority carriers in the form of electrons 805 into P-epitaxial layer 810 and P+ substrate 820. While some of these electrons recombine with holes 807, or are collected by the source 809, the net result is that the entire region around drain 811 will be flooded with minority carriers. If the voltage on drain 811 is suddenly pulled positive again (either by inductor 830 or some other device), these minority carriers prevent the voltage from rising until they are removed or have recombined with holes. Once the minority carriers have been exhausted, the voltage will then rise very rapidly, causing a large dv/dt and a large displacement current. This large displacement current, along with any impact ionization currents, can in turn cause a voltage drop within the P-epitaxial layer 810 of MOSFET 800. If the P-epitaxial layer 810 becomes more positive than the N+ source 809, it begins to inject electrons and triggers bipolar conduction. Turning on the parasitic bipolar transistor in the MOSFET 800 can lead to the snapback condition illustrated in FIG. 7A.

If, however, a pseudo-Schottky diode 850 is connected to MOSFET 800, with its "cathode" terminal 852 connected to drain 811 of MOSFET 800 and its "anode" terminal 854 connected to P+ substrate 820, which is grounded, the risk of snapback can be greatly reduced. Using the example described above, when the inductor 830 pulls the cathode of the pseudo-Schottky diode 850 and drain 811 of MOSFET 800 below ground, pseudo-Schottky diode 850 will begin to conduct (through its channel) before the parasitic PN diode 802. Thus, the current will be shunted away from the MOSFET 800 by pseudo-Schottky diode 850. Consequently, the presence of minority carriers in MOSFET 800 will be greatly diminished. Moreover, pseudo-Schottky diode 850 can be integrated with MOSFET 800, as will be explained later in this application.

Figure 9:
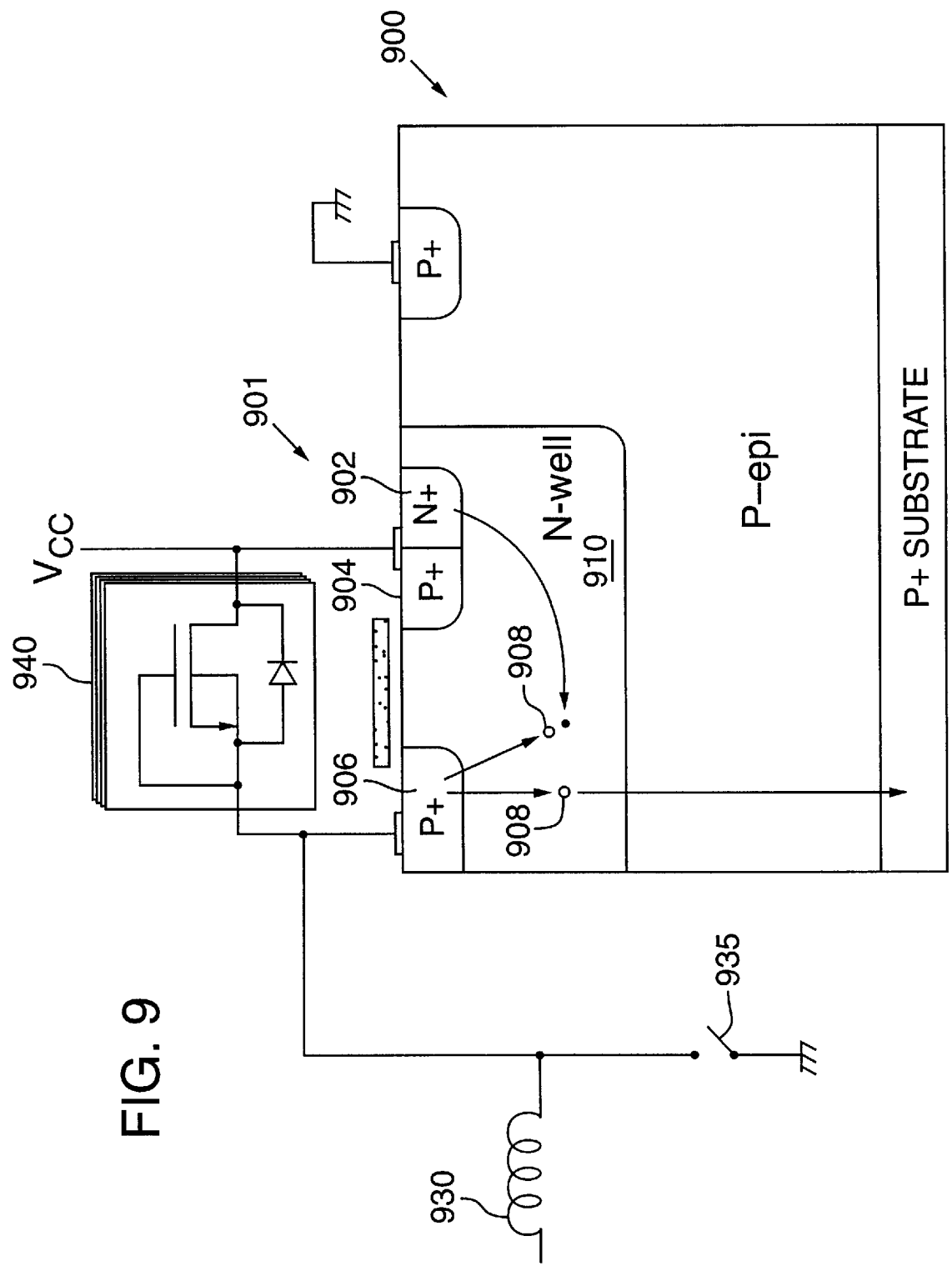
FIG. 9 illustrates a cross-sectional view of an IC showing the use of a pseudo-Schottky diode to prevent snapback of a parasitic PNP bipolar transistor in a P-channel MOSFET.

FIG. 9A illustrates snapback in a P-channel MOSFET 901, which is fabricated in a N-well 910 of an IC 900. The P+ source 904 and N+ body contact 902 are shorted together and tied to $V_{cc}$. The P+ drain 906 is connected to an inductor 930 and a switch 935, which is tied to ground. When the switch 935 is opened, the voltage at the inductor 930 and the drain 906 will fly up above $V_{cc}$. In this situation, the PN diode at the junction between P+ drain 906 and N-well 910 becomes forward-biased, which causes minority carriers in the form of holes 908 to be injected into N-well 910. Furthermore, a parasitic bipolar PNP transistor, formed by the P+drain 906 acting as the emitter, the N-well 910 acting as the base, and the P+ substrate 914 acting as the collector, has a base-to-collector voltage equal to $V_{cc}$. Therefore, the parasitic PNP transistor will be turned on and will cause the snapback problem illustrated in FIG. 7A.

However, if the voltage at drain 906 were clamped at $V_{cc}$ or below, the parasitic diode will not turn on; and the parasitic PNP transistor will not cause the snapback problem. MOSFET 901 can be clamped with an N-channel pseudo-Schottky diode 940 configured with its cathode connected to $V_{cc}$ and its anode connected to P+ drain 906. With pseudo-Schottky diode 940 in place when the switch 935 is opened and the inductor 930 pulls the drain 906 above $V_{cc}$, pseudo-Schottky diode 940 will turn on before the parasitic PN diode turns on and clamp drain 906 at $V_{cc}$. Alternatively, a P-channel pseudo-Schottky diode can be used in parallel with the MOSFET 901, or MOSFET 901 can be adjusted to exhibit the pseudo-Schottky effect itself.

FIG. 10 illustrates a latchup condition that can occur in an integrated circuit 1000 which contains an N-channel MOSFET 1010 and a N-well 1020. An inductor 1040 is connected to the N+ drain 1011 of MOSFET 1010. The N+ source 1012 and P-epitaxial layer 1013 of the MOSFET 1010 are tied to ground. In certain situations the inductor 1040 can pull the N+ drain 1011 below ground and thus forward-bias the parasitic diode formed by the P-epi layer 1013 and N+ drain 1011. Therefore, the drain 1011 will inject minority carriers in the form of electrons 1014 into the substrate. These electrons 1014 will recombine with holes 1016. However since the holes 1016 are traveling through P type material, the holes will encounter resistance 1015. Therefore, the current caused by the movement of the holes 1016 will create a resistive voltage drop (V=IR) in the P-epi layer 1013 and P+ substrate.

The IR drop will in turn cause any grounded N+region, such as source 1012, to be more negative than the surrounding P type material. Therefore the parasitic diode 1017, formed by the source 1012 and P-epi layer 1013, becomes forward-biased and injects minority carrier in the form of electrons 1018 of its own. These electrons 1018 may be collected by any N type material, where they will drift to the most positive potential that they can find. For example the electrons 1018 can be swept into the N-well 1020 and drift to the N+ region 1025 connected to $V_{cc}$. However, once the electrons 1018 enter the N-well, they become majority carriers and will thus create a voltage drop that may forward-bias parasitic diode 1028, formed by the N-well 1020 and a P+ region 1027, which represents any P+ region in the IC chip (such as a P+ region associated with a PMOSFET). P+ region 1027 will then inject holes 1029 which can be collected by the P+ epi layer 1013. The presence of holes 1029 fortifies the forward biasing of the parasitic diode 1017, which causes the injection of electrons 1018. As mentioned above, electrons 1018 were the cause of the forward biasing of parasitic diode 1028. Therefore, even if the inductor 1040 were to return to ground or higher the parasitic diodes 1017 and 1028 would remain forward-biased and continue to conduct current with very low voltage drop, thus exhibiting the latchup condition illustrated in FIG. 7B.

Since the initial cause of the latchup condition was the injection of electrons 1014 into the substrate, the problem can be prevented by connecting the cathode of a pseudo-Schottky diode 1050 to N+ drain 1011 and connecting the anode of the pseudo-Schottky diode to ground. In this case, when the inductor 1040 drives the drain 1011 below ground, pseudo-Schottky diode 1050 will shunt the electrons to ground, since pseudo-Schottky diode 1050 has a lower turn-on voltage than the parasitic PN diode formed by the junction of N+ drain 1011 and P-epi layer 1013. Without the electrons 1014 to forward-bias parasitic diode 1017, the latchup condition will not occur.

Another major use of the pseudo-Schottky diode is in power converters. Various power converter topologies are built around the relationships between a power source, an inductor, a load, and switches and diodes. In such topologies, the diodes are switched between being forward- and reverse-biased. As mentioned above, a PN diode is a minority carrier device and will store minority carriers when it is forward-biased. When the diode is switched to reverse-bias, the stored charge can cause a long recovery time and large dv/dt.

In cases when a PN diode is allowed to conduct current in the forward direction, the manner in which it turns off is affected by the quantity of charge stored at its PN junction while it was conducting. When the diode is operating in steady-state forward conduction, the quantity of stored charge is proportional to the forward biased conduction current; the higher the forward bias, the greater the quantity of stored charge which must be depleted at turn-off. Therefore, the quantity of stored charge can be reduced by limiting the voltage drop across the diode when it is conducting current in the forward direction.

Figure 22A:
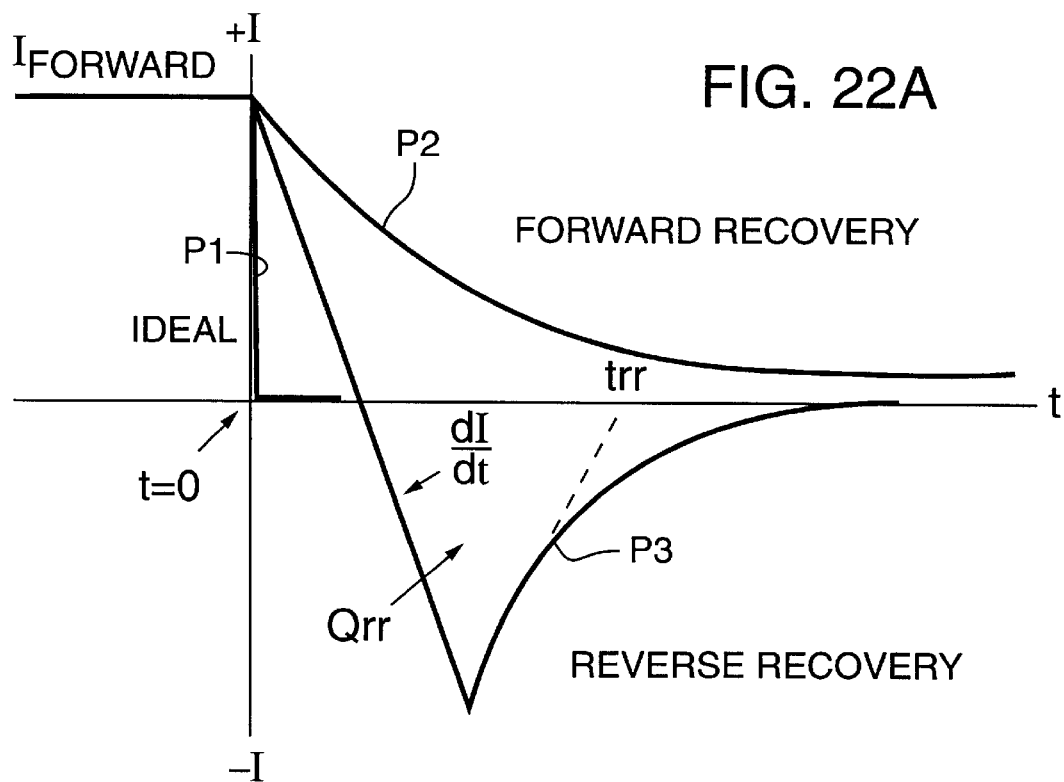
FIGS. 22A and 22B illustrate graphs showing the voltage and current waveforms in a diode during the recovery period following various types of switching.

FIG. 22A illustrates a plot of current (I) versus time (t) during the turn-off of a conventional PN diode, turn-off occurring at a time t=0. Curve P1 illustrates the ideal, with the current falling almost instantly from its steady-state forward level ($I_{forward}$) to zero at t=0. Two scenarios are illustrated. Curve P2 shows what happens if the terminals of the diode are shorted. In this situation, the stored charge slows the turn-off. Curve P3 shows what happens if polarity of the voltage across the diode is suddenly reversed by applying a voltage $V_{DD}$. The turn-off is accelerated somewhat, but at a penalty in behavior and performance. First the current is driven toward zero at a slope dI/dt, but because some of the stored charge is still present when the current reaches zero, the current reverses polarity. As a result, current is pulled in a direction opposite to the direction of $I_{forward}$. Eventually, the current reaches a peak reverse value, and then it decays back to zero exponentially. This turn-off scenario is therefore limited by diffusion. In FIG. 22A, where the dashed line reaches I=0 gives an estimate of where the actual current is at a level equal to about 10% of the peak reverse current. This time is designated $t_{rr}$, and the area under the curve P3 to this point is designated as $Q_{rr}$. The reverse current shown by curve P3 is thus a non-ideal consequence of the storage of charge at the junction of a PN diode during forward conduction. It can interact adversely with other components in an IC and can cause added losses in a power converter.

Figure 22B:
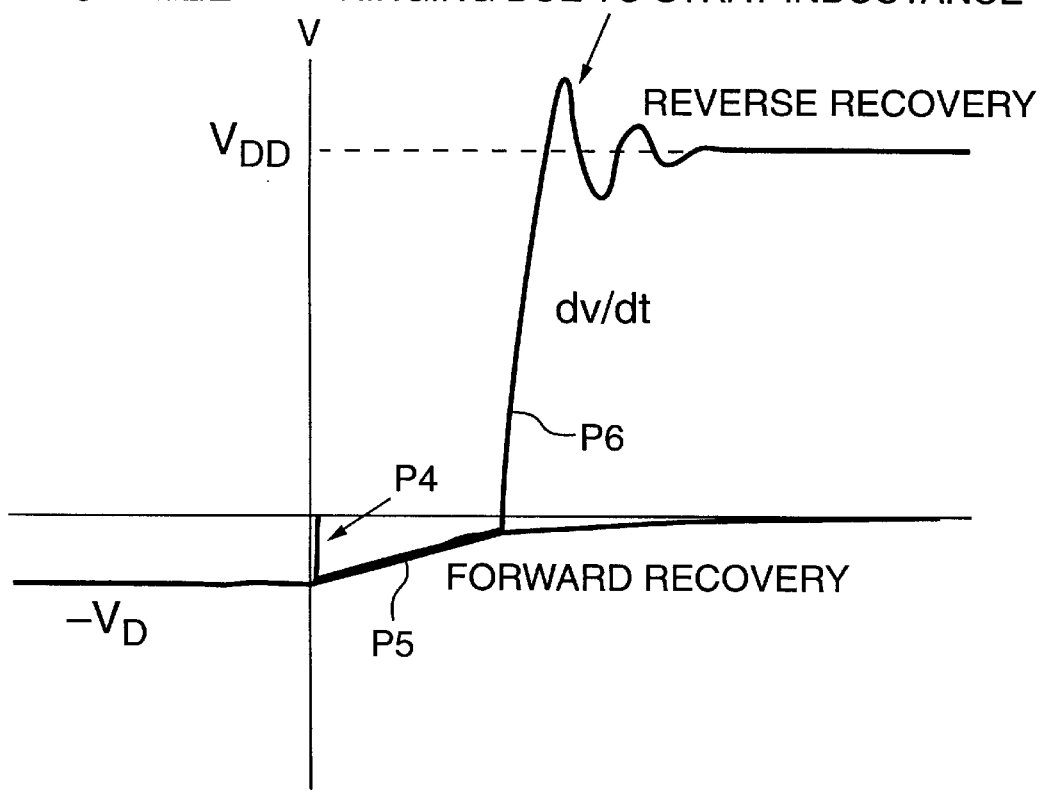

Another aspect of the stored charge is shown in FIG. 22B, which is a plot of the voltage (V) versus time. Curve P4 showtime, Curve P4 shows the ideal, with the voltage drop across the diode during forward conduction ($-V_D$) falling to zero at time t=0, limited only by its own resistance and depletion capacitance. In reality, because of the stored minority carriers, the process takes longer. Curve P5 corresponds to curve P2 in FIG. 22A and shows that the voltage across the diode decays exponentially from $-V_D$ when the terminals of the diode are shorted. Curve P6 corresponds to curve P3 in FIG. 22A and shows that, when the diode is reverse-biased with a voltage $V_D$, the voltage across the diode decays slightly (roughly along the same path as curve P5) until most of the stored charge near the junction is removed. Then the voltage rises very rapidly at a rate dV/dt to the reverse voltage $V_{DD}$. The displacement current may increase power losses and induce parasitic interactions in ICs, and if the turn-off is too rapid (i.e., snappy) the voltage may overshoot $V_{DD}$ as a result of parasitic inductance. This may lead to breakdown in the devices or in other devices. An increase in noise, both through conduction and electromagnetic radiation, may also result.

In summary, the charge stored near the junction of a conventional PN diode during forward conduction produces many undesirable effects. These effects can be reduced by using a pseudo-Schottky diode in place of or in parallel with the PN diode. A pseudo-Schottky diode can also be used in parallel with any intrinsic PN diode in a MOSFET, or the MOSFET itself can be designed to behave as a pseudo-Schottky diode. In any of these applications, the pseudo-Schottky diode operates to reduce the voltage drop across a forward-biased PN junction. This in turn reduces the forward current across the PN junction and the quantity of charge that is stored near the junction during the period of forward conduction.

Figure 11A:
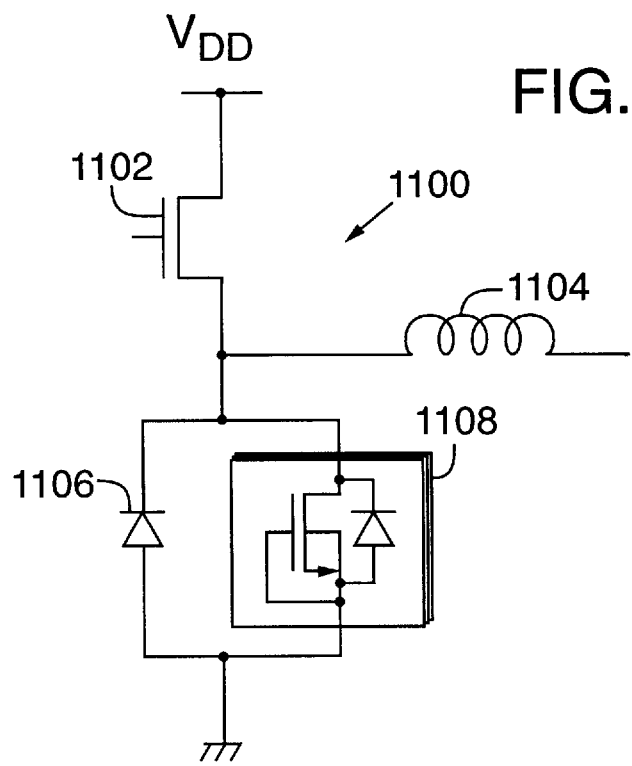
FIGS. 11A–11F illustrate circuit diagrams showing various uses of pseudo-Schottky diodes in power convertors.

FIGS. 11A–11F show several power converter topologies which utilize pseudo-Schottky diodes to minimize minority carrier build up. FIG. 11A shows a buck converter 1100 comprising a high-side switch 1102, an inductor 1104, and a PN diode 1106 in parallel with a pseudo-Schottky diode 1108. Whenever high-side switch 1102 is opened, the inductor 1104 (whose current is constant so long as repeated switching occurs at a high frequency) forces conduction through diode 1106 and parallel pseudo-Schottky diode 1108. The diode handling the recirculating current is known as the rectifier.

Figure 11B:
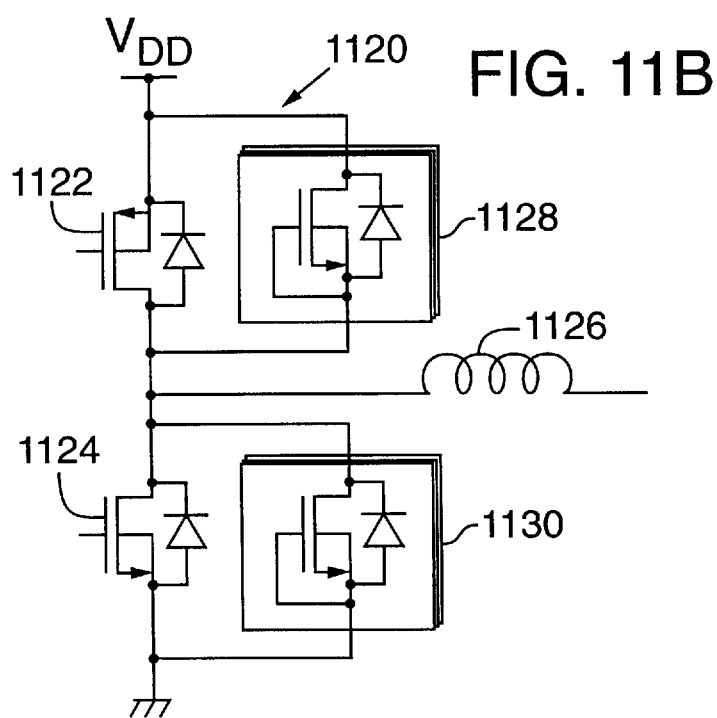

FIG. 11B shows a synchronous buck converter 1120 comprising a P-channel MOSFET 1122 in parallel with a pseudo-Schottky diode 1128, an inductor 1126, and an N-channel MOSFET 1124 acting as the rectifier in parallel with a pseudo-Schottky diode 1130. During operation of the synchronous buck converter 1120, the P-channel MOSFET 1122 and the N-channel MOSFET 1124 are turned on off alternately, MOSFET 1122 being off when MOSFET 1124 is on and vice-versa. There is a brief "break-before-make" interval, however, when both MOSFETs are turned off, i.e., one of the MOSFETs must be turned off before the other is turned on to avoid a short between $V_{dd}$ and ground. During this interval, the switching of inductor 1126 will cause one of the parasitic diodes of the two MOSFETS will be forward-biased. The presence of pseudo-Schottky diodes 1128 and 1130 will shunt current around the parasitic diodes and thus minimize any minority carrier build up while they are forward-biased. Ideally, pseudo-Schottky diode 1128 is not needed except to clamp overshoot during the turn-off of low-side MOSFET 1124 during any diode recovery.

Figure 11C:
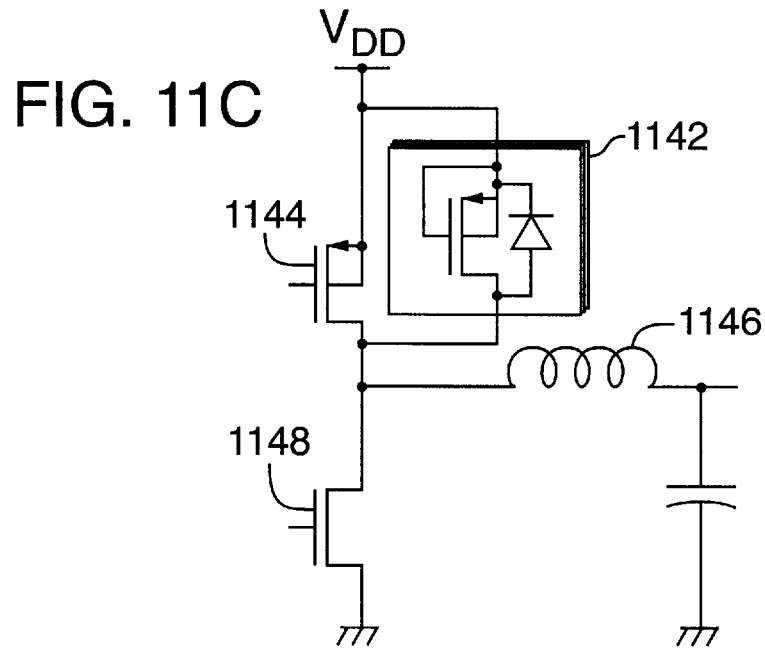

FIG. 11C illustrates a buck converter which includes a P-channel MOSFET 1144 acting as the high side switch and connected in parallel with a P-channel pseudo-Schottky diode 1142 in place of the N-channel pseudo-Schottky diode 1128 shown in FIG. 11B.

Figure 11D:
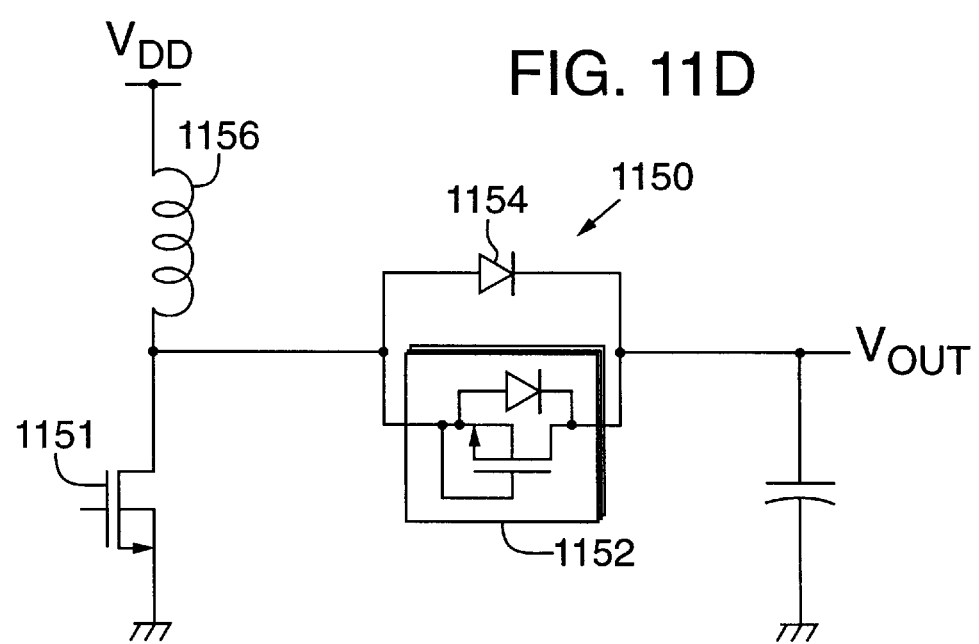

FIG. 11D shows a boost converter 1150 which has a pseudo-Schottky diode 1152 in parallel with a rectifier diode 1154. In the operation of converter 1150, the low-side switch 1151 is turned on so as to store energy in inductor 1156. Low-side switch 1151 is then turned off, causing the voltage at the drain of switch 1151 to fly above $V_{out}$, thereby forward-biasing diode 1154. Feedback controls the "on" time of switch 1151 to hold $V_{out}$ constant. Pseudo-Schottky diode 1152 shunts current from diode 1154, reducing power losses and preventing forced diode recovery (i.e., the application of a reverse voltage to a diode which has charge stored from a previous forward conduction).

Figure 11E:
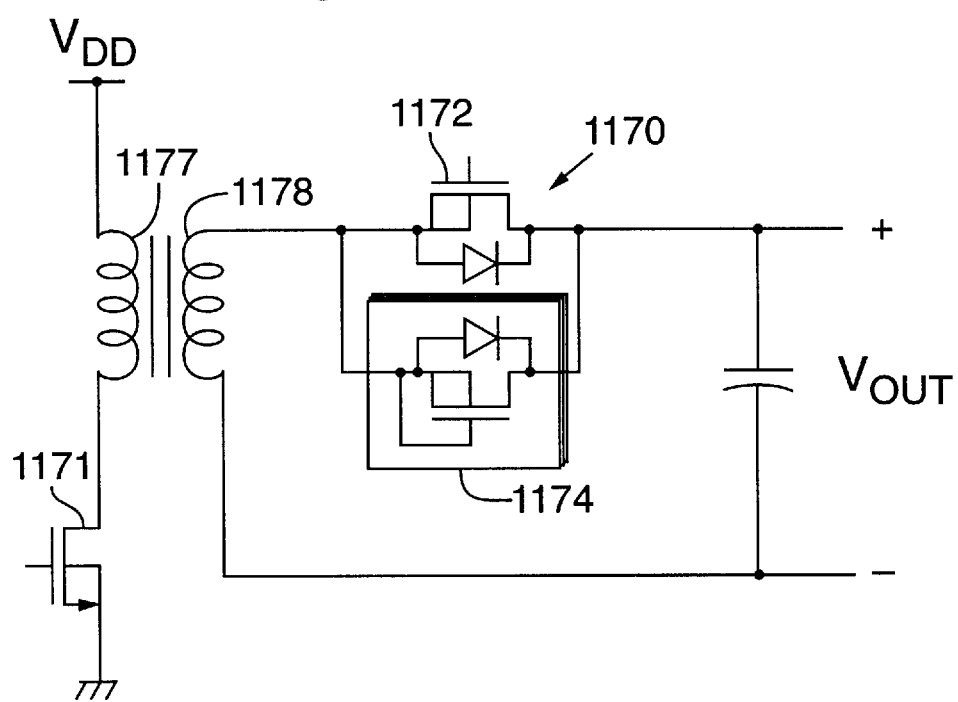

FIG. 11E shows flyback converter 1170 with a MOSFET 1172 acting as a synchronous rectifier in parallel with a pseudo-Schottky diode 1174. As in the boost converter shown in FIG. 11D, low-side MOSFET 1171 is turned on to energize primary coil 1177. The turns in primary coil 1177 and secondary coil 1178 are oriented such that in this condition the intrinsic antiparallel diodes in MOSFET 1172 and pseudo-Schottky diode 1174 are reverse-biased and do not conduct current. MOSFETs 1171 and 1172 cannot be switched simultaneously because this would cause a "shoot through" current which would discharge the output capacitor. Accordingly, there is a "break-before-make" interval between the turn-off of MOSFET 1171 and the turn-on of MOSFET 1172. During this interval, current flows in the forward direction through pseudo-Schottky diode 1174 until the channel of MOSFET 1172 is turned on. It is this forward current that charges the output capacitor. Power losses are reduced during the break-before-make interval by shunting through pseudo-Schottky diode 1174 the current that would otherwise flow through the intrinsic antiparallel diode of MOSFET 1172.

Figure 11F:
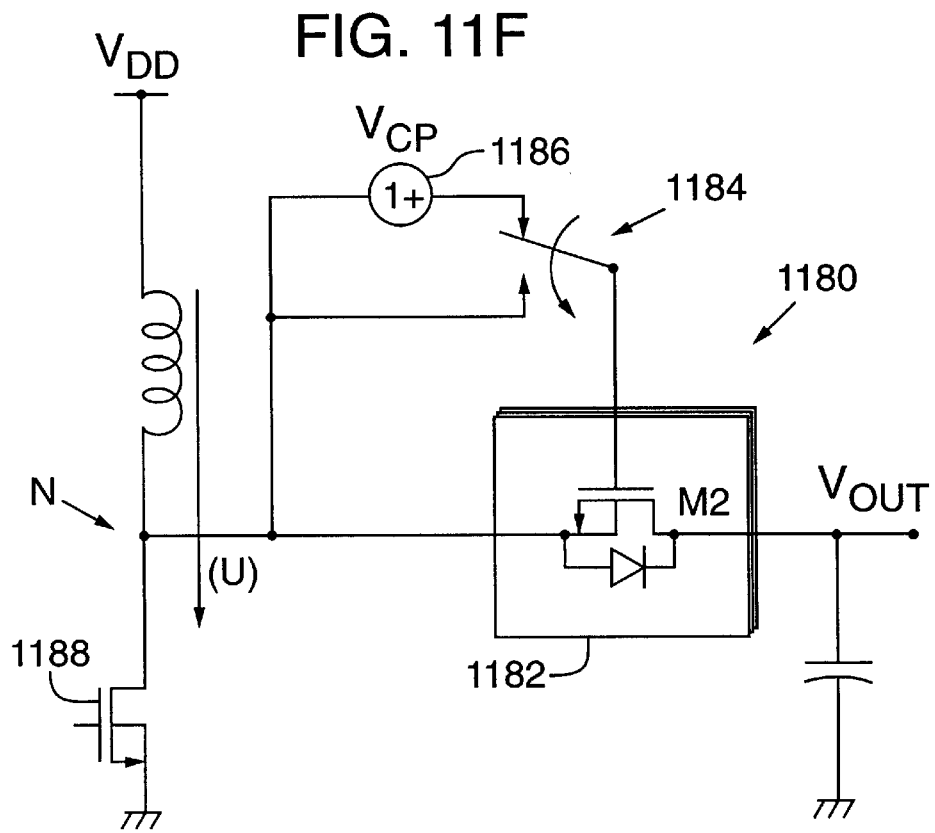

FIG. 11F illustrates a circuit diagram of a circuit which includes a three-terminal MOSFET 1182 in accordance with another aspect of this invention. Switching-mode boost converter 1180 includes a switch 1184 which alternately connects the gate of MOSFET 1182 to either the source of MOSFET 1182 or a positive voltage $V_{cp}$ supplied by a charge pump 1186. A low-side MOSFET 1188 acts as a shunt switch. While low-side MOSFET 1188 is turned on, switch 1184 ties the gate and source of MOSFET 1182 together. Since at this time $V_{out}$ is higher than the voltage at node N, the channel in MOSFET 1182 is turned off and the intrinsic antiparallel diode within MOSFET 1182 is reverse-biased.

In the break-before-make interval between the turn-off of MOSFET 1188 and the turn-on of MOSFET 1182, the voltage at node N begins to fly up. During this interval, since the gate and source of MOSFET 1182 remain tied together, MOSFET 1182 exhibits the pseudo-Schottky effect and a current flows through the channel of MOSFET 1182, which constitutes a relatively low resistance path as compared to the path through the antiparallel diode of MOSFET 1182. The break-before-make interval ends when switch 1184 connects the gate of MOSFET 1182 to the voltage $V_{cp}$ supplied by charge pump 1186, thereby turning MOSFET 1182 fully on and providing a path for current to flow from node N towards the output terminal. With this arrangement, the IV power loss in MOSFET 1182 during the break-before-make interval is significantly less than would occur if, for example, the gate of MOSFET 1182 were grounded and the current flowed entirely through its antiparallel diode.

Similarly, a pseudo-Schottky diode can be used in other types of converters, such as forward converters, where the pseudo-Schottky diode can be connected so as to shunt or replace a forward-conducting diode.

Figure 11G:
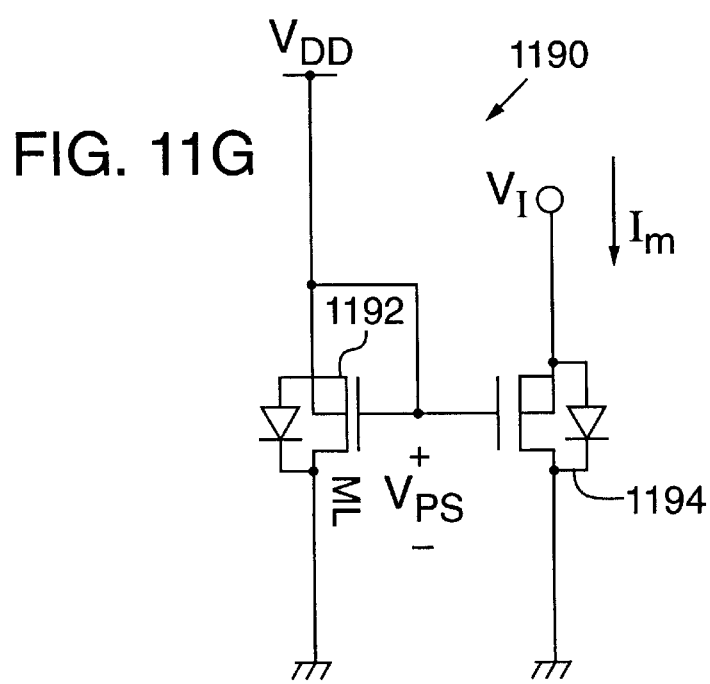
FIG. 11G illustrates a circuit diagram showing the use of a pseudo-Schottky diode in a current mirror arrangement.

A pseudo-Schottky diode may also be used in a current mirror, as shown in FIG. 11G. A current-mirror arrangement 1190 contains a pseudo-Schottky diode 1192 and a MOSFET 1194, whose drains and gates are tied together. The gate and source of pseudo-Schottky diode 1192 are tied together and to the positive supply voltage $V_{dd}$. The mirror current $I_m$ is driven by a variable voltage $V_I$. In a conventional current mirror using bipolar transistors or MOSFETs, the current mirror ceases to function properly when $V_I$ falls to a voltage in the range of 0.7 V. The current mirror may also fail if $V_{DD}$ falls too low, e.g. around 0.7 V. In contrast, current mirror arrangement 1190 operates with $V_I$ as low as about 0.4 V. While $V_I$ is restricted to a voltage less than a diode drop (~0.7 V), in many circuits this does not create a problem. For example, in a circuit supplied by a one-cell battery the supply voltage is about 0.9 V. Other components insure that the voltage across the pseudo-Schottky diode itself will not exceed 0.7 V, and it is very useful to have the current mirror function at voltages 0.2 V or so below the normal lower limit of 0.7 V.

Figure 12A:
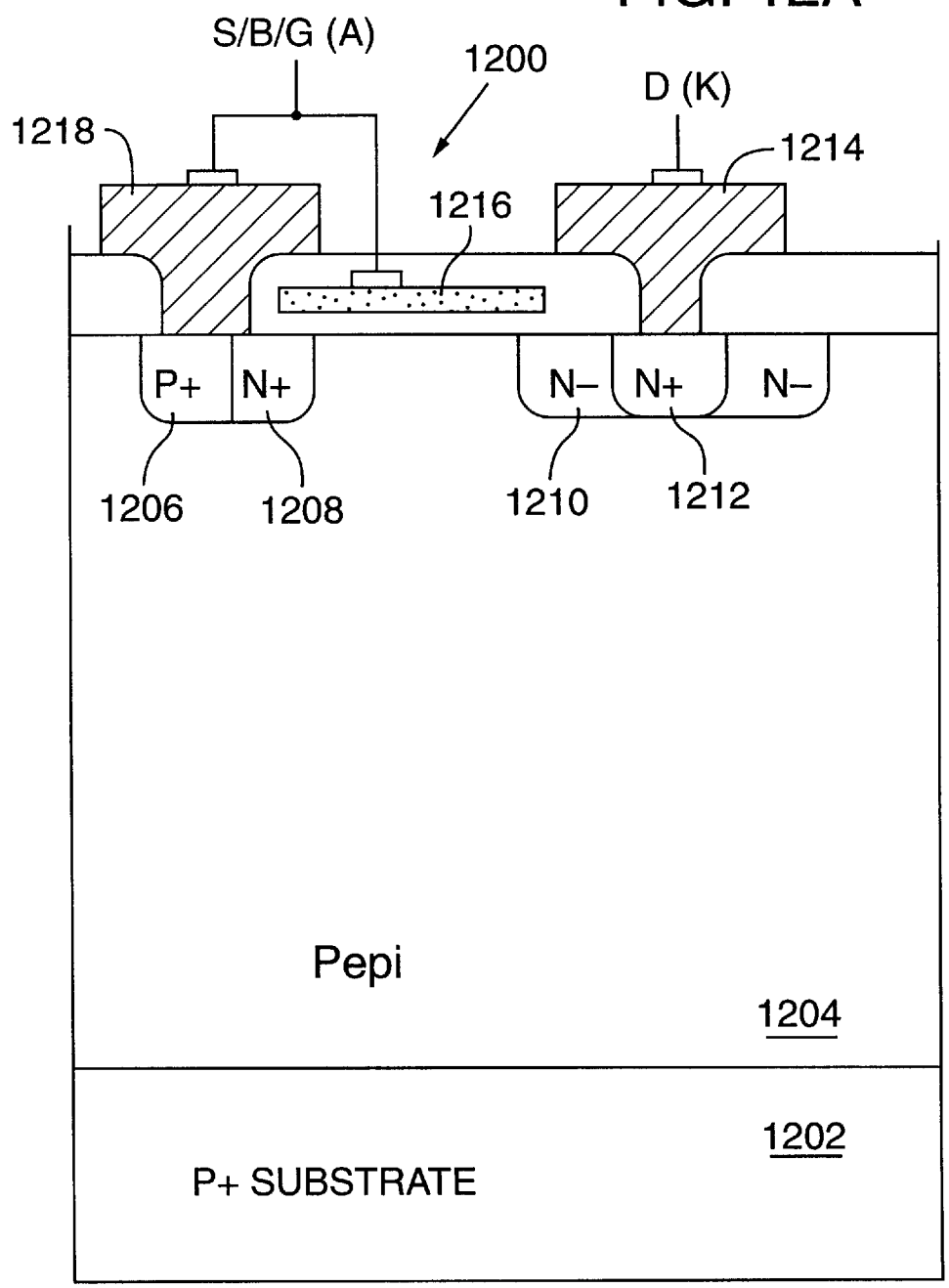

FIGS. 12A–12C illustrate cross-sectional views showing the structure of several embodiments of a pseudo-Schottky diode. FIG. 12A shows in cross-section an embodiment of a pseudo-Schottky diode 1200 formed in a lateral configuration. An P-epitaxial layer 1204 is grown upon a P+ substrate 1202 using conventional techniques. A P+ body contact 1206 and an N+ source 1208 are shorted by a metal source/body contact 1218. A gate 1216 is also connected to the source/body contact 1218, thus making the source/body contact 1218 the anode of pseudo-Schottky diode 1200. A metal drain contact 1214, which connects to the N+ drain 1212, is the cathode of pseudo-Schottky diode 1200. An N-drift region 1210 is located adjacent N+ drain 1212.

FIG. 12B shows a pseudo-Schottky diode formed in a vertical trenched-gate configuration. The N+ substrate 1231 forms the drain of the MOSFET. An N-epitaxial layer 1232 is grown on N+ substrate 1231. A P-body region 1234 is implanted in N-epitaxial layer 1232. N+source regions 1238 are implanted into P-body region 1234. A trench 1239 is then etched through the source and body regions and into the N-epitaxial layer 1232. The trench is filled with in gate 1236 which is separated from the N+ source 1238, P-body 1234, and N-epitaxial layer 1232 by a gate oxide layer 1240. A metal layer 1241 shorts the P-body and N+ source regions and is also connected to the gate 1236 to form the anode of pseudo-Schottky diode 1230. The N+ substrate 1231, which is also the drain, acts as the cathode of pseudo-Schottky diode 1230.

FIG. 12C shows a pseudo-Schottky diode 1250 formed in a vertical double-diffused (DMOS) configuration. An N+ substrate 1251 acts as the drain of the MOSFET. An N-epitaxial layer 1252 is grown on the surface of the substrate 1251. P-body regions 1254 are implanted and diffused into the top surface of the N-epitaxial layer 1252. P+ body contact regions 1256 and N+ source regions 1258 are implanted and diffused into the P-body regions 1254. A gate 1260 overlies channel regions within P-body regions 1254. Gate 1260, P+ body contact regions 1256, and N+ source regions 1256 are connected to a metal layer 1262, which forms the anode of pseudo-Schottky diode 1250. N+ substrate 1251 serves as the cathode of pseudo-Schottky diode 1250.

In each of the embodiments shown in FIGS. 12A–12C, the doping concentrations and the gate oxide thickness are chosen so as to amplify the pseudo-Schottky effect. A threshold adjust implant will normally be required. The gate may be driven independently, but in most applications the gate will be connected to the source and body when the pseudo-Schottky diode is conducting, e.g., in the break-before-make intervals in the power converters shown in FIGS. 11A–11F.

Figure 13:
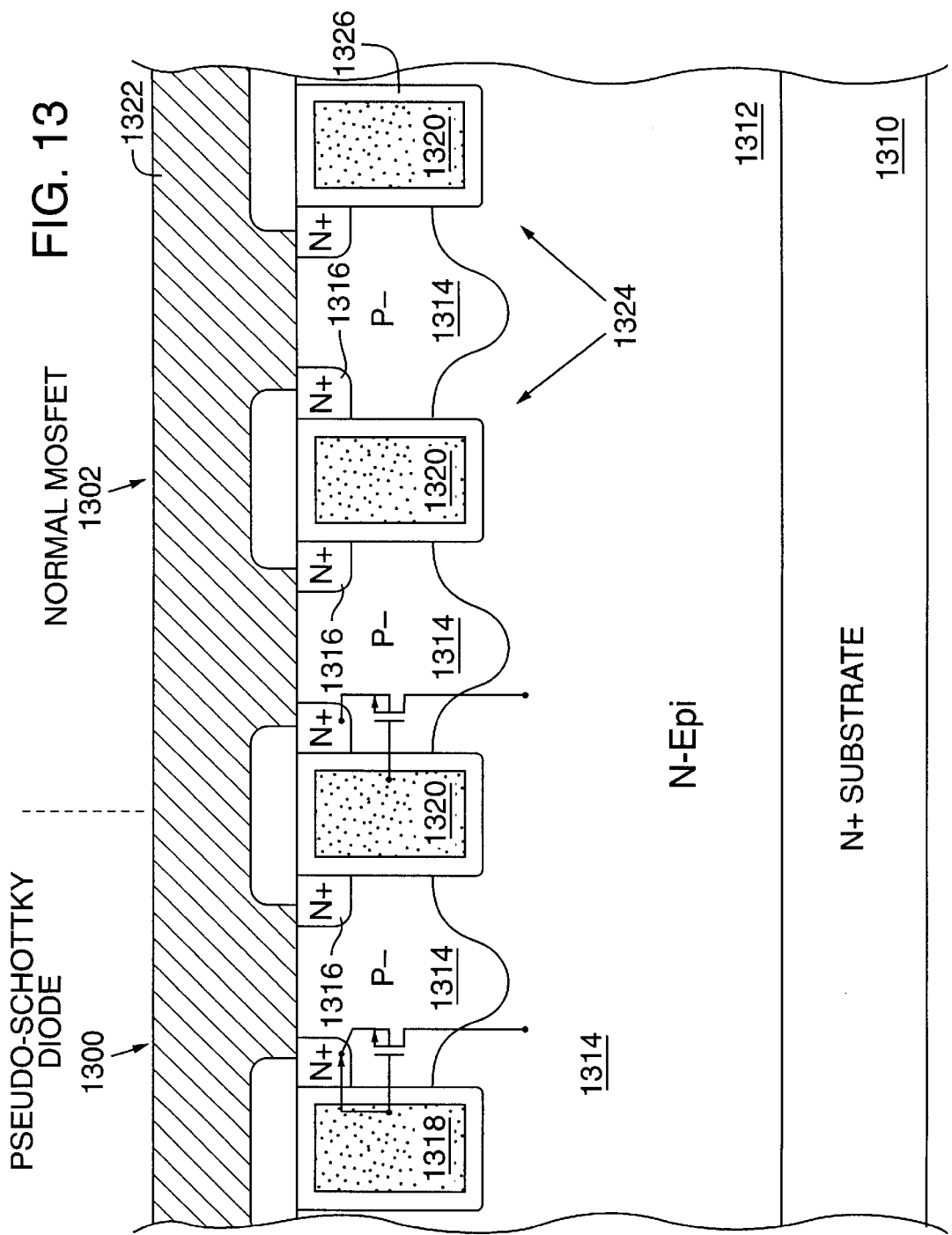
FIG. 13 illustrates a cross-sectional view of a pseudo-Schottky diode (with the source-gate short shown symbolically).

FIG. 13 shows a cross-sectional view of a pseudo-Schottky diode 1300 in combination with a MOSFET 1302. An N-epitaxial layer 1312 is grown on an N+ substrate 1310. A P-body region 1314 is implanted into the N-epitaxial layer 1312. N+ source regions 1316 are implanted into the P-body region 1314. Trenches 1324 are then etched through the N+ source regions 1316 and P-body region 1314 and into the N-epitaxial layer 1312. The trenches 1324 are filled with a first gate 1318 or a second gate 1320, both of which are separated from N+ source regions 1316, P-body region 1314, and N-epitaxial layer 1312 by an oxide layer 1326. A metal layer 1322 contacts the P-body region 1314 and N+ source regions 1316, and is also connected to gate 1318. With the structure shown in FIG. 13, if the N+ source regions become biased positively with respect to the N+ substrate (drain), pseudo-Schottky diode 1300 is turned on and minimizes the storage of charge at the body-drain junction of MOSFET 1302. With pseudo-Schottky diode 1300 used as a clamp in this way, current is instantaneously redistributed to pseudo-Schottky diode 1300 when it is forward-biased. In this structure, however, the conventional MOSFET does not need to be made in accordance with the pseudo-Schottky method.

Design Criteria for the Pseudo-Schottky Diode

In designing a pseudo-Schottky diode, the turn-on voltage of the pseudo-Schottky diode ($V_{PS}$) should be minimized relative to the turn-on voltage of the PN diode that is to be shunted.

A two-terminal pseudo-Schottky diode can be characterized as a MOSFET wherein $V_{gs}=V_{bs}=V_{ds}$, where $V_{gs}$ is the gate-to-source voltage, $V_{bs}$ is the body-to-source voltage, and $V_{ds}$ is the drain-to-source voltage. The equation for the drain current ($I_d$) for a saturated MOSFET is given as:

$$I_{D_{sat}} = \frac{\mu C_{ox}}{2} \frac{W}{L} (V_{gs} - V_t)^2$$

where $\mu$ is the carrier surface mobility (cm$^2$/Vsec), $C_{ox}$ is the capacitance of the gate oxide layer (F/cm$^2$), W and L are the channel width and length, respectively. $V_t$, the threshold voltage of the MOSFET, can be expressed as:

$$V_t = V_{t_o} + \gamma(\sqrt{|V_{sb} + \Psi_B|} - \sqrt{\Psi_B})$$

where $V_{to}$ is the extrapolated threshold voltage (i.e., the voltage where the MOSFET current extrapolates to zero), $\gamma$ is the body effect factor (V$^{-\frac{1}{2}}$), and $\Psi_B$ is the bulk voltage (i.e., the voltage needed to bend the energy bands in the silicon body region, often assumed to be twice the Fermi potential $$2\phi f = 2 \frac{kT}{q} \ln \frac{N_B}{n_i}$$

but actually somewhat larger in a strong inversion (typically 0.65–0.8 V)).

Combining the equations for $I_{Dsat}$ and $V_t$ gives the drain current as:

$$I_{D_{sat}} = \frac{\mu C_{ox}}{2} \frac{W}{L} \{V_{gs} - [V_{t_o} + \gamma(\sqrt{|V_{sb} + \Psi_B|} - \sqrt{\Psi_B})]\}^2$$

Since $V_{gs}=V_{bs}=V_{ds}$ in a pseudo-Schotty diode, we can substitute $V_{PS}$ for $V_{gs}$, $V_{bs}$, and $V_{ds}$ to obtain the current equation of a pseudo-Schottky diode:

$$\frac{I_{D_{sat}}}{W} = \frac{\mu C_{ox}}{2L} \{V_{PS} - [V_{t_o} + \gamma(\sqrt{|-V_{PS} + \Psi_B|} - \sqrt{\Psi_B})]\}^2$$

which can be rewritten as:

$$V_{PS} = V_{t_o} - \gamma(\sqrt{\Psi_B} - \sqrt{|\Psi_B - V_{PS}|}) + \sqrt{\frac{2L}{\mu C_{ox}} \cdot \frac{I_{D_{sat}}}{W}}$$

$C_{ox}$, the capacitance of the oxide layer, can be expressed as $X_{ox}/\epsilon_{ox}$, where $X_{ox}$ is the gate oxide thickness and $\epsilon_{ox}$ is the permittivity of silicon dioxide. The body effect factor $\gamma$ is given by:

$$\gamma = (\sqrt{2q\epsilon_s N_B}) \frac{X_{ox}}{\epsilon_{ox}}$$

where $N_B$ is the dopant concentration in the body region and $\epsilon_s$ is the permittivity of silicon.
Therefore we have:

$$V_{PS} = V_{t_o} - \left[(\sqrt{2q\epsilon_s N_B}) \frac{X_{ox}}{\epsilon_{ox}} (\sqrt{\Psi_B} - \sqrt{|\Psi_B - V_{PS}|})\right] + \sqrt{\frac{2L}{\mu} \frac{X_{ox}}{\epsilon_{ox}} \cdot \frac{I_{D_{sat}}}{W}}$$

While the term $V_{t0}$ also contains the terms $X_{ox}$ and $N_B$, it is assumed here that a threshold adjusting ion implantation is used to adjust the threshold voltage to some target value to compensate for any changes in $X_{ox}$ and $N_B$. Therefore, $V_{t0}$ can be viewed as an independent variable.

Empirical data have shown that $V_{PS}$ is approximately 0.3 to 0.5 V, since $\Psi_B$ is in the range of 0.65 V. Therefore, the second term of the $V_{PS}$ equation is positive but will lower $V_{PS}$ since it is subtracted from the first and third terms of the equation. Since $V_{PS}$ appears in the second term of the equation, to actually determine $V_{PS}$ the equation must be solved with an iterative process until the answer converges. However, the presence of $V_{PS}$ in the second term does not change the relationship that $V_{PS}$ is inversely proportional to the second term. The first and third terms are positive so that raising or lowering their values will lead to corresponding changes of $V_{PS}$. As mentioned above, ideally $V_{PS}$ is as small as possible relative to the parasitic diode turn-on voltage. Without a threshold adjust implantation, $V_{t0}$ is constrained by other factors and can not be used to control $V_{PS}$. The two variables that can then be most easily adjusted in the equation for $V_{PS}$ are $X_{ox}$ and $N_B$.

Increasing $X_{ox}$ will increase the second term, which would decrease $V_{PS}$ in the second term. However, increasing $X_{ox}$ will also increase the third term which will increase $V_{PS}$. Therefore, the relationship of $V_{PS}$ and $X_{ox}$ involves counteracting effects, and accordingly the use of $X_{ox}$ alone to control $V_{PS}$ is not generally sufficient.

Increasing $N_B$ will increase the second term of the equation for $V_{PS}$, which will lower $V_{PS}$. However, $V_{t0}$ is also increased if $N_B$ is increased. Fortunately, techniques have been developed which use a "threshold adjust" implant to adjust $V_{t0}$ to a required level after the $N_B$ of the device has been set. The threshold voltage $V_t$ is therefore generally adjusted by ion implantation to a final value in the range of 0.45 to 0.95 V, but generally between 0.6 and 0.7 V (no body effect). These techniques are described in application Ser. No. 07/855,373, filed Mar. 20, 1992, now abandoned, and application Ser. No. 07/854,162, now U.S. Pat. No. 5,248,627, issued on Sep. 28, 1993, filed Mar. 20, 1992, each of which is incorporated herein by reference in its entirety. Therefore, to minimize $V_{PS}$, $N_B$ should be set to as high a value as possible given other required characteristics of the device such as breakdown voltage. A threshold adjust implant which is too high can lead to mobility denigration and an increase in on-resistance. Further improvement in $V_{PS}$ can be obtained by finding the optimal value of $X_{ox}$ for the given value of $N_B$. For a two-terminal device the gate oxide should be a relatively thick, e.g., $X_{ox}$=400–1000 Å or more. On the other hand, if the device is to operate as both a pseudo-Schottky diode and a synchronous rectifier, the gate oxide must be kept thin to minimize on-resistance.

The low-threshold voltage and simultaneous high body effect (which lowers the threshold voltage in Quadrant III operation) can be achieved by any method where a high concentration region of depth greater than the maximum depletion region from the gate (when inversion occurs) is counterdoped by a thin implanted layer or surface layer which is substantially depleted when the device is biased off. The counterdoping layer results in a shift in the threshold voltage $\Delta V_t$ which is given by:

$$\Delta V_t = \frac{Q_{imp}}{C_{ox}} = \frac{Q_{imp} X_{ox}}{\epsilon_{ox}}$$

For an N-channel device, the threshold adjust implant must be N-type dopant (arsenic or phosphorous) implanted into the silicon surface, or an immobile positive ion such as cesium implanted into the gate oxide. The dosage of the gate oxide charge must be increased if the charge is not located at the interface between the gate oxide and the silicon, e.g., a charge located halfway through the gate oxide requires twice the dosage to obtain the same shift of threshold voltage.

Modifying the threshold voltage equation, the required $V_t$ adjust dose is given by:

$$Q_{imp} = \frac{\epsilon_{ox}}{X_{ox}} \left[ V_{to}(\text{target}) - \left( V_{FB} \pm \Psi_B \pm \frac{\sqrt{2q\epsilon_{si}}\, X_{ox}}{\epsilon_{ox}} \sqrt{N_B} \left( \sqrt{\Psi_B} \right) \right) \right]$$

where the plus signs are used for N-channel devices and the minus signs are used for P-channel devices, and where $$\Psi_B \approx 2\left( \frac{kT}{q} \ln \frac{N_b}{n_i} \right) + 6 \frac{kT}{q}$$

and $$V_{FB} = \phi_{ms} - \frac{Q_f}{C_{ox}} = \phi_m - \phi_s - \frac{Q_f X_{ox}}{\epsilon_{ox}}$$

where $\phi_m$ is the work function of the gate material and $\phi_s$ is the work function of the silicon such that $V_{FB}$ defines the so called "flat band" condition (generally a negative number around 0.5 to 1.5 V). The term kT/q is known as the thermal voltage (around 26 mV at room temperature) where k is Boltzmann's constant. The term $n_i$ is the intrinsic carrier concentration of silicon, having a value around $1.4 \times 10^{10}$ cm$^{-3}$ at room temperature. $Q_f$ is the fixed oxide charge, around $2 \times 10^{10}$ cm$^{-2}$.

FIG. 16 illustrates the challenges in developing a simple analytical model of the pseudo-Schottky effect. The gate width normalized current (I/W) is plotted as a function of $V_{gs}$ for the threshold-connected configuration (FIG. 1B) and the pseudo-Schottky configuration, assuming both a strong inversion model and a weak inversion model. Curves P7 and P8 represent the weak inversion model of the pseudo-Schottky and threshold-connected configurations, respectively; curves P9 and P10 represent the strong inversion model of the pseudo-Schottky and threshold-connected configurations, respectively. The previous equations are derived under the assumption that the silicon surface of an on-state MOSFET is strongly inverted. In such a model, the gate width normalized current falls precipitously near the threshold. Even so, the strong inversion equation can be used to predict the influence of the body effect in lowering $V_t$ when in Quadrant III. Also in FIG. 16 curve P11 plots the value of $V_t$ for the pseudo-Schottky diode as a function of $V_{sb}$ (which is the same as $-V_{gs}$). At lower currents and voltages, the drain current varies exponentially with gate voltage. This region of operation is known as weak inversion, where the diffusion (rather than drift) current dominates. The conduction can be thought of as a gate-induced barrier lowering of the built-in source to body energy barrier.

The normalized current for the weak inversion model is defined as follows:

$$\frac{I}{W} = \frac{\mu C_{ox} \gamma \left( \frac{kT}{q} \right)^2 e^{\frac{\psi_{sa}(V_{gb}) - 2\phi_f}{\left(\frac{kT}{q}\right)}}}{2L \sqrt{\psi_{sa}(V_{gb})}} \left( e^{\left(\frac{-V_{sb}}{\frac{kT}{q}}\right)} - e^{\left(\frac{-V_{db}}{\frac{kT}{q}}\right)} \right)$$

where $\gamma$ is the previously defined body effect factor, kT/q is the 26 mV thermal voltage, and the surface potential is now less than in strong inversion such that $$\psi_{sa}(V_{gb}) \equiv \left( -\frac{\gamma}{2} + \sqrt{\frac{\gamma^2}{4} + V_{gb} - V_{FB}} \right)^2$$

Notice that the current varies exponentially with gate voltage (where $V_{gb} = V_{gs} + |V_{sb}|$), making the weak inversion behavior of a MOSFET exhibit a straight line behavior on semilog paper just like the diode equation. Since the equation is based on a barrier-lowering effect, the weakly inverted MOSFET is very much like a diode except that it is a majority carrier device. Since the Schottky diode is a majority carrier device depending on barrier-lowering for conduction, it is appropriate to refer to this MOSFET as a pseudo-Schottky. Note, however, that the weak inversion equation overestimates the current of a normal MOSFET beyond 0.4 V (see curves P7,P8) while the strong inversion equation underestimates the current below 1 V (see curves P9,P10). For a pseudo-Schottky diode, the weak inversion equation is valid up to 0.3 V and the strong inversion equation is valid down to about 0.5 V. These values can be confirmed by comparing the theoretical curves of FIG. 16 with the measured values shown in FIG. 5B. Therefore, 0.5 V pseudo-Schottky voltage is somewhat predicted by the strong inversion equation. A detailed description of the MOS equation themselves is given in The *MOS Transistor*, by Y. Tsividis, McGraw-Hill, New York (1987), ISBN # 0-07-065381-X, particularly Chapter 4, but without any suggestion of the pseudo-Schottky phenomenon or the optimization thereof. According to the text, the region between strong and weak inversion is not easily modeled and relies on complex and numerically noisy iterative solutions. Unfortunately, it is this region where the pseudo-Schottky effect is most pronounced. If one plots the ratio of the values represented by the curves PS and PN in FIG. 5B against $V_{ds}$, the peak ratio of nearly 800 is evident at around 0.4 to 0.5 V. Nonetheless, the strong inversion equations can be used to optimize the pseudo-Schottky effect.

FIG. 17 illustrates the pseudo-Schottky current I/W ($\mu$A/$\mu$m) as a function of background doping $N_B$ and gate oxide thickness. The threshold voltage $V_t$ was 0.7 V and the voltage across the diode $V_{ps}$ was 0.5 V. As indicated, the three curves are for gate oxide thicknesses of 1000 Å, 400 Å and 175 Å. While any device having a current over 0.1 $\mu$A/$\mu$m with no more than a voltage drop of 0.5 V may be useful, a target current of at least 1 $\mu$A/$\mu$m is needed for general purpose power devices. For example, a L=2 $\mu$m 20 V lateral power NMOS having an on-resistance of 300 m$\Omega$ may have a 120,000 $\mu$m channel width and would be able to handle 120 mA of current in Quadrant III without substantial PN diode current or stored charge. From FIG. 17, a 1000 Å thick gate oxide needs a background doping of $10^{16}$ cm$^{-3}$ to handle 1 μA/μm of current, a 400 Å thick gate oxide needs a doping of $4\times10^{16}$ cm$^{-3}$, and a 175 Å thick gate oxide requires $1.5\times10^{17}$ cm$^{-3}$ channel doping.

FIG. 18 illustrates the same information as a response surface where the x-axis is body doping concentration ($N_B$), the y-axis is gate oxide thickness ($X_{ox}$) and each line represents current in μA/μm scaled logarithmically from 0.1 to 1 in tenths, from 1 to 10 in unit steps. Comparing the 400 Å data of FIG. 17 at $N_B=2\times10^{16}$ cm$^{-3}$ predicts a current of 0.3 μA/μm, a value in close agreement with the measured data represented by curve PS at $V_{ds}=0.5$ V in FIG. 4B.

Figure 19:
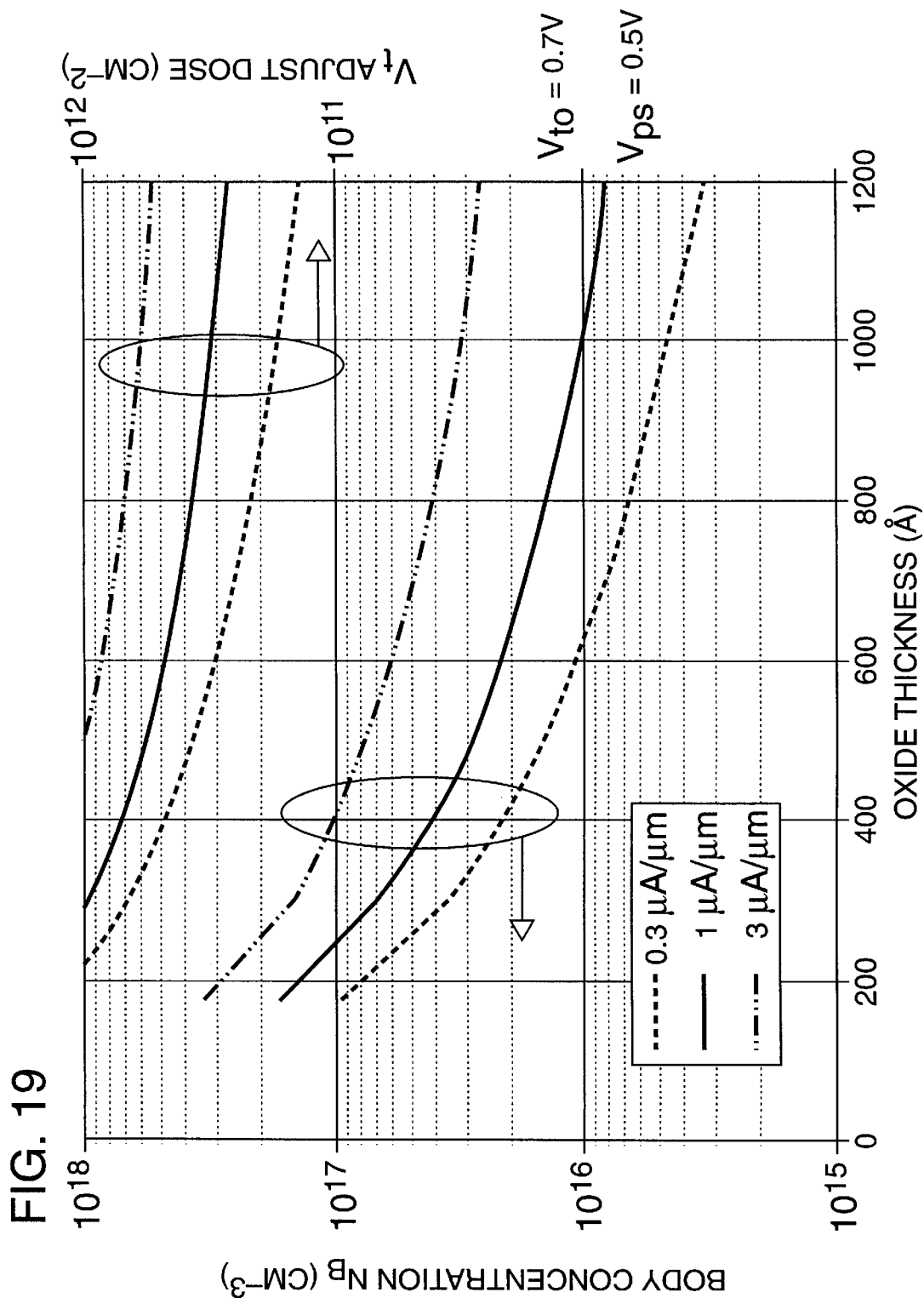
FIG. 19 illustrates a graph containing two sets of curves showing the gate oxide thickness, body doping concentration and threshold adjust dose required to achieve three different current densities in a pseudo-Schottky diode.

FIG. 19 summarizes the body and threshold adjust doping requirements to achieve a current density of 0.3 μA/μm, 1 μA/μm, or 3 μA/μm for a pseudo-Schottky drop in a device with a threshold voltage $V_{t0}=0.7$ V. For each oxide thickness plotted along the horizontal axis, the required body doping concentration $N_B$ and the required threshold adjust implant dose to hold $V_t=0.7$ V and $V_{PS}=0.5$ V are plotted on the lefthand and righthand vertical axes, respectively. Note that for lateral devices an increase in the body doping lowers the device breakdown. This limit is not operative in vertical DMOS devices since most of the depletion spreading occurs in the substrate (drain).

It should be noted that gate oxide thicknesses above 500 Å are not useful for MOSFETs used both as synchronous rectifiers and pseudo-Schottky diodes.

Figure 20:
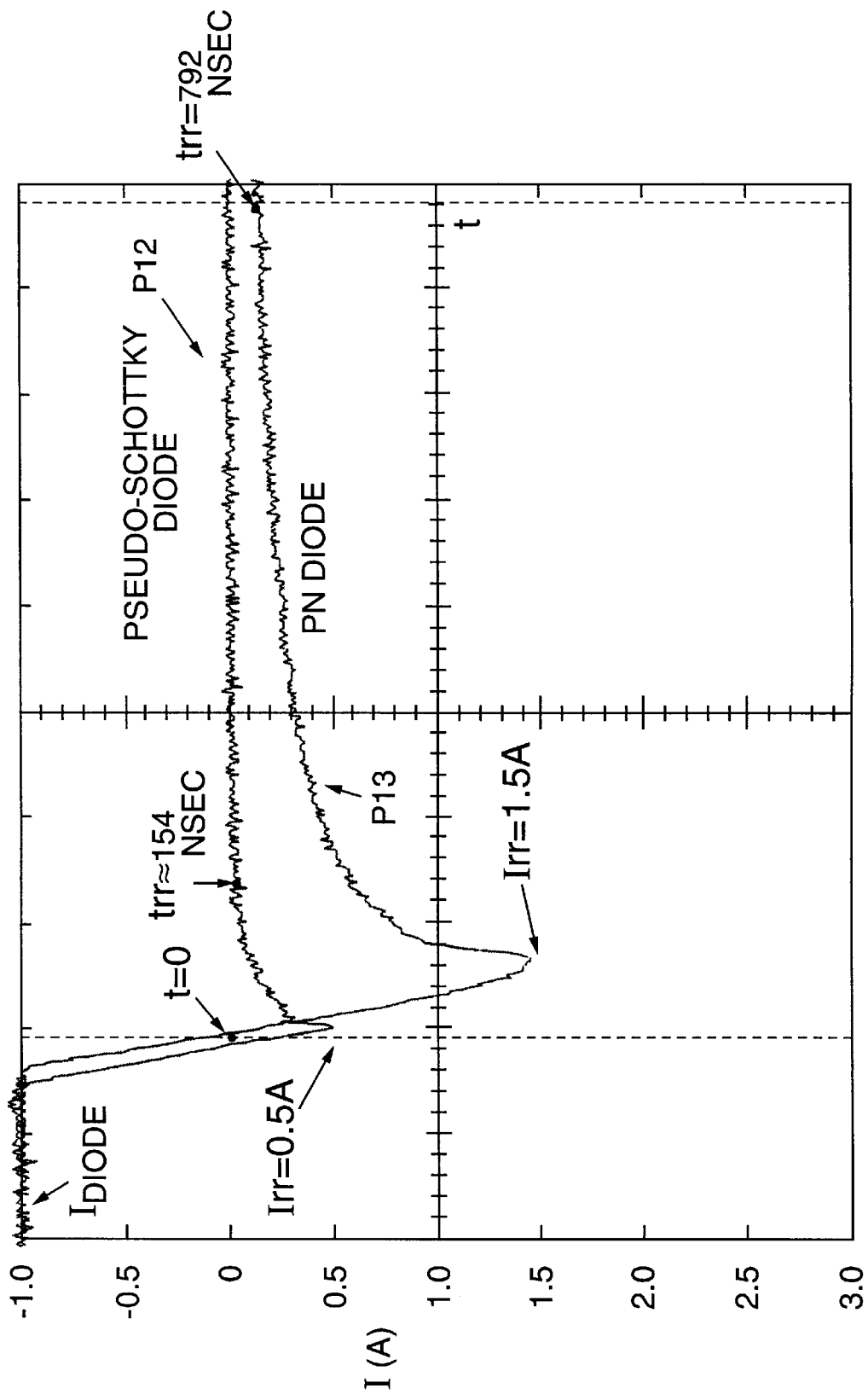
FIG. 20 illustrates a graph which compares the reverse recovery characteristics of a pseudo-Schottky diode with those of an ordinary P-N diode.
Figure 21:
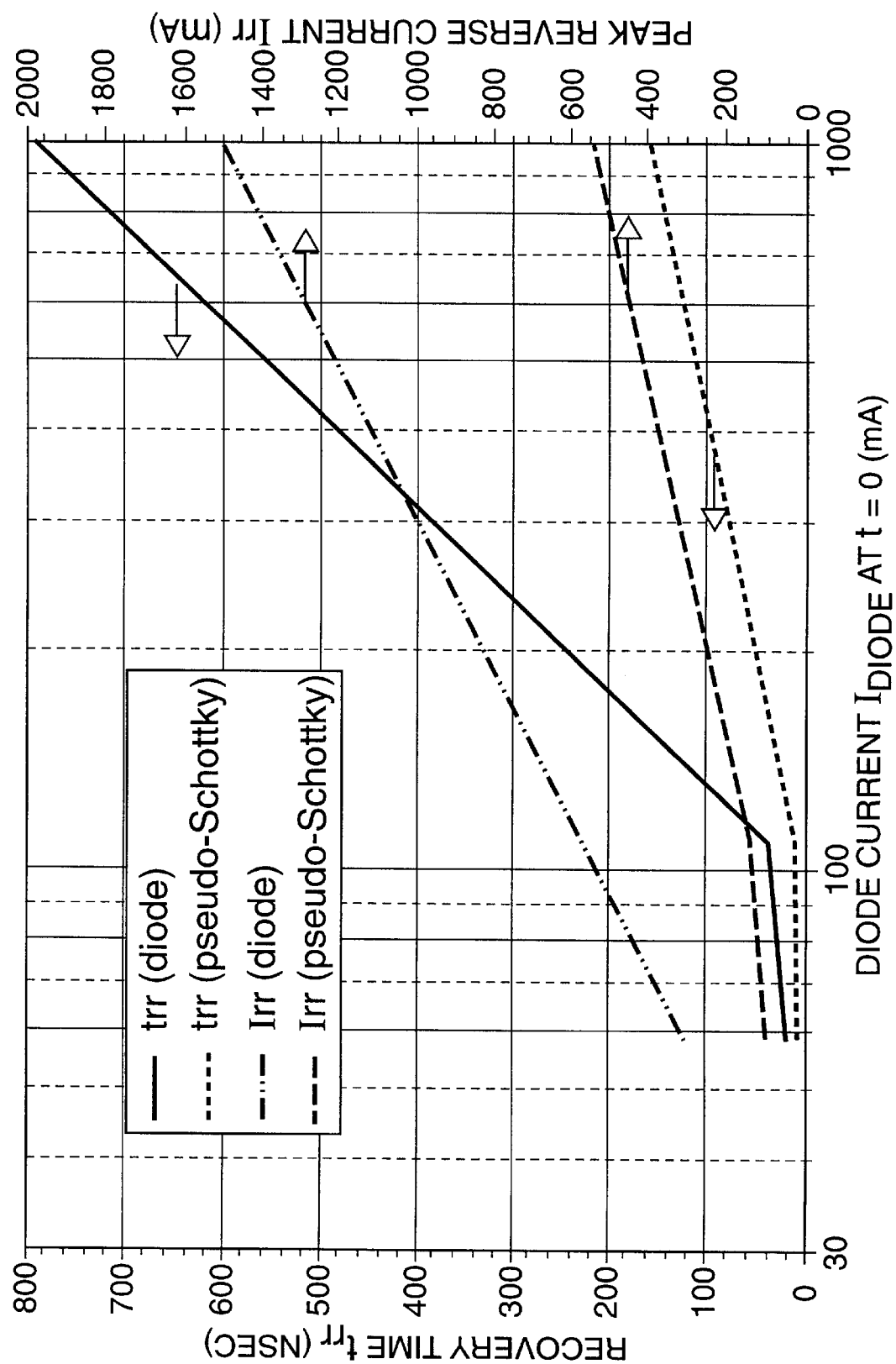
FIG. 21 illustrates a graph which compares the measured reverse recovery time and the peak reverse current of a pseudo-Schottky diode with those of an ordinary P-N diode.

To prove that the pseudo-Schottky diode is a majority carrier device, it was compared to the PN diode contained within the same MOSFET with the channel biased off. FIG. 20 is a plot of the measured reverse recovery time of both devices biased at a starting current of −1.0 A at t=0. Curve P12 represents the current in the pseudo-Schottky diode; curve P13 represents the current in the diode. The reverse current of the diode peaked at 1.5 A and took 792 nsec to reach 10% of its peak value, while the pseudo-Schottky diode required peaked at only 0.5 A and required only 154 nsec to reach 10% of its peak value, roughly a 3× improvement in $I_{rr}$ and a 5× improvement in $t_{rr}$. FIG. 21 is a graph of $I_{rr}$ and $t_{rr}$ for a pseudo-Schottky diode and conventional PN diode, respectively, as a function of current and illustrates that the superiority in performance of the pseudo-Schottky diode is evident over a wide range of currents. The lefthand vertical axis shows the recovery time $t_{rr}$ in nanoseconds and the righthand vertical axis shows the peak reverse current $I_{rr}$ in mA.

Figure 14C:
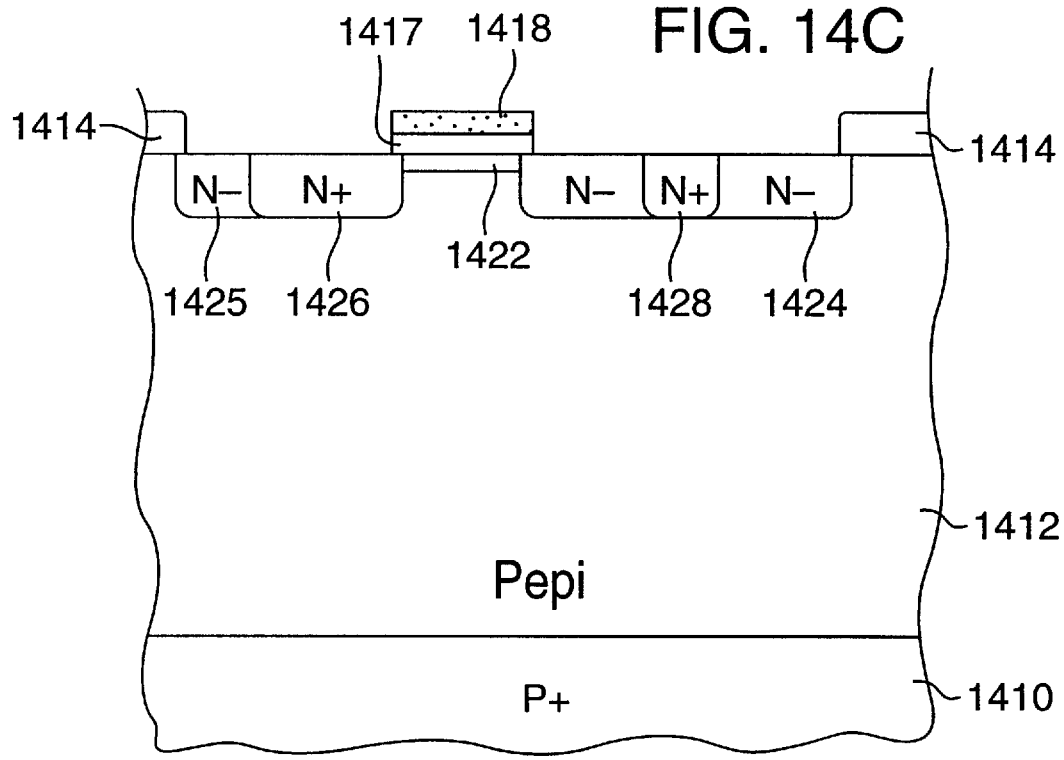
Figure 14D:
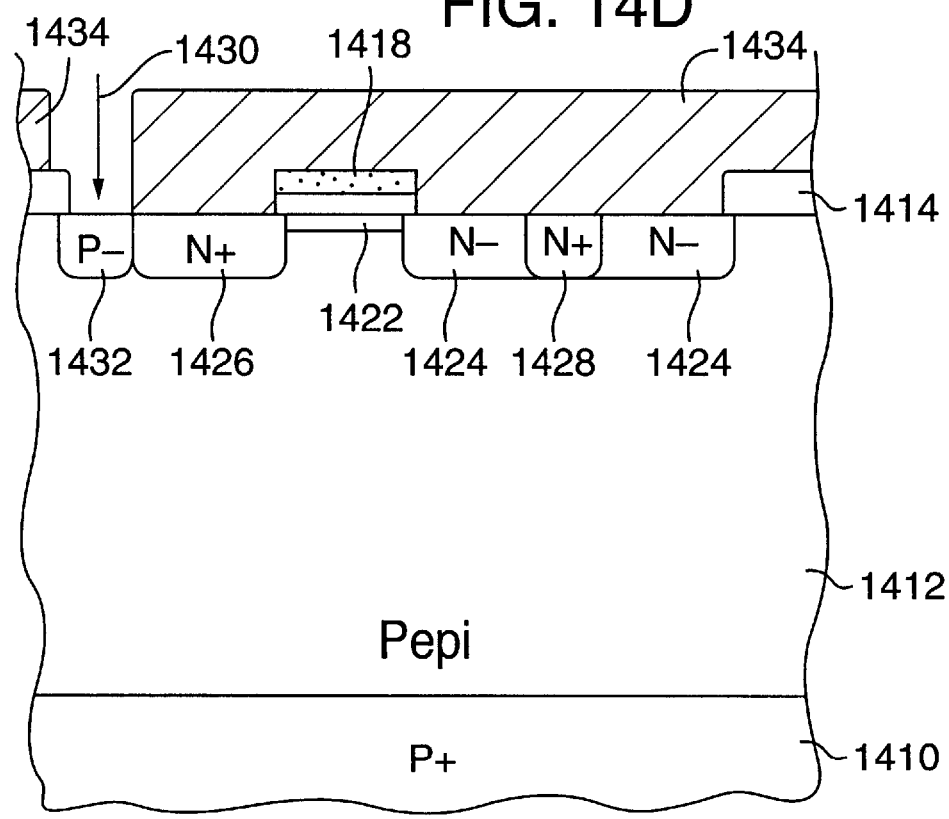

FIGS. 14A–14E show a sequence of manufacturing steps that can be used to obtain an pseudo-Schottky diode based on a lateral MOSFET. As shown in FIG. 14A, a P-epitaxial layer 1412, with a moderate dopant concentration (e.g., $1\times10^{15}$ to $1\times10^{18}$ cm$^{-3}$) is grown on a P+ substrate 1410. The magnitude of body doping needed to enhance the pseudo-Schottky effect is related to the gate oxide thickness. As is shown below, a 1000 Å thick gate oxide can be useful for doping concentrations over $2\times10^{15}$ cm$^{-3}$, while a gate oxide thickness of 400 Å needs a minimum doping concentration of $1.5\times10^{16}$ cm$^{-3}$. A 175 Å thick gate oxide needs a body doping concentration of at least $7\times10^{16}$ cm$^{-3}$ to be useful.

An oxide layer 1414 is used to define the active region of the device. An N-type counter dopant 1416 (phosphorous or arsenic) is implanted at the surface of P-epitaxial layer 1412, thereby forming a threshold adjust region 1422 wherein the net concentration of P-type dopant is lower than in the remainder of P-epitaxial layer 1412. In FIG. 14B, a gate oxide layer 1417 and polysilicon gate 1418 have been formed over the counter-doped threshold adjust region 1422 using conventional techniques. The thickness of gate oxide layers may range from 80 Å to 2000 Å, but it is more commonly in the range of 175 Å to 700 Å. The polysilicon gate electrode is typically 1500 Å to 6000 Å thick and is generally doped with phosphorus for an N-channel device and with boron for a P-channel device. It may be shorted by a titanium or tungsten silicide layer.

An N-type dopant 1420 (phosphorus) is implanted into the exposed portions of P-epitaxial layer 1412 to form an N-drift region 1424 and an N− region 1425. The drift implant may be omitted for 5 V or less devices having a channel length of 2 μm or less, but a side wall spacer drift on the order of 0.25 long may be needed for devices having a submicron channel length.

Figure 14E:
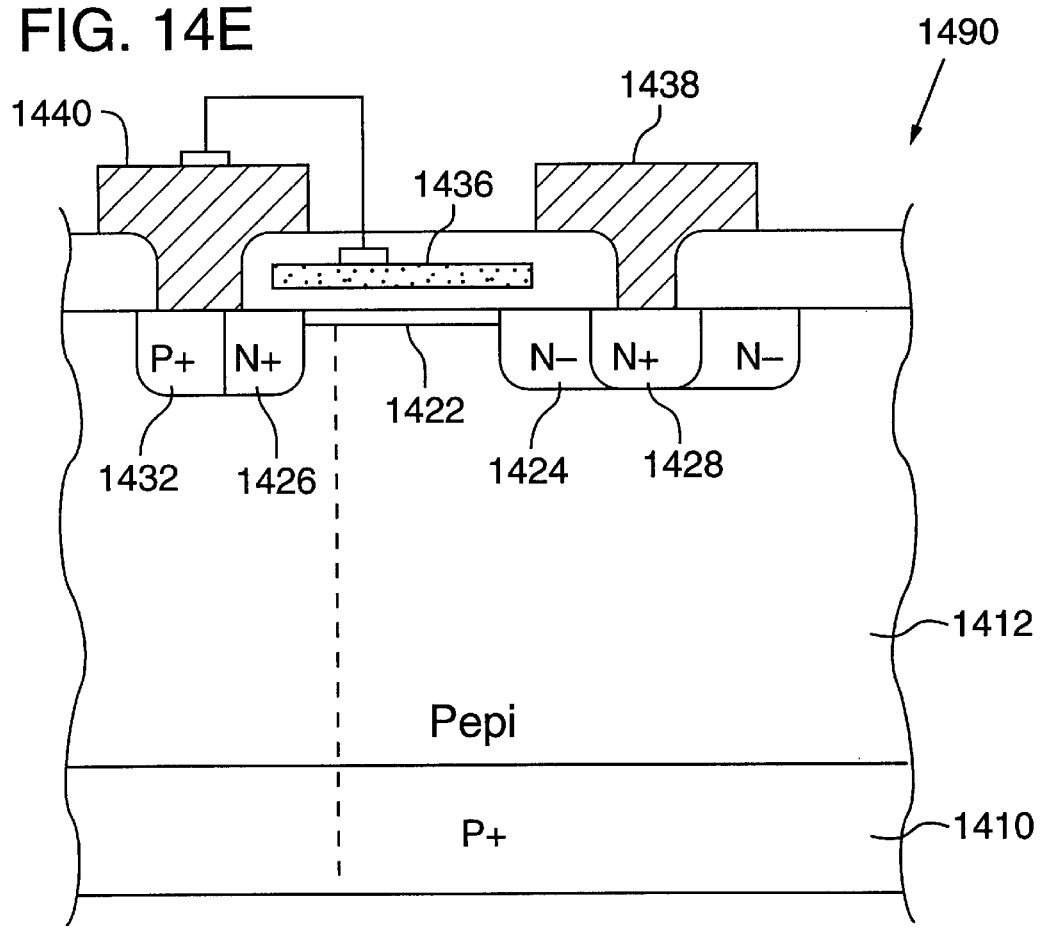

FIG. 14C shows the result of a third N-type implant, which forms an N+ source region 1426 and an N+ drain region 1428. N− region 1425 is converted into P+ body contact region 1432 in FIG. 14D by implanting a P-type dopant 1430 (boron). A photoresist layer 1434 prevents the boron implantation from reaching other areas of the device. FIG. 14E shows the resulting pseudo-schottky diode 1490 after a source/body metal contact layer 1440 and a drain metal contact layer 1438 are added. The gate 1418 is electrically connected to the source/body contact layer 1440 (but may also be driven independently). The source/body contact layer 1440 acts as the anode of pseudo-Schottky diode 1490, and drain contact layer 1438 acts as the cathode.

Figure 14F:
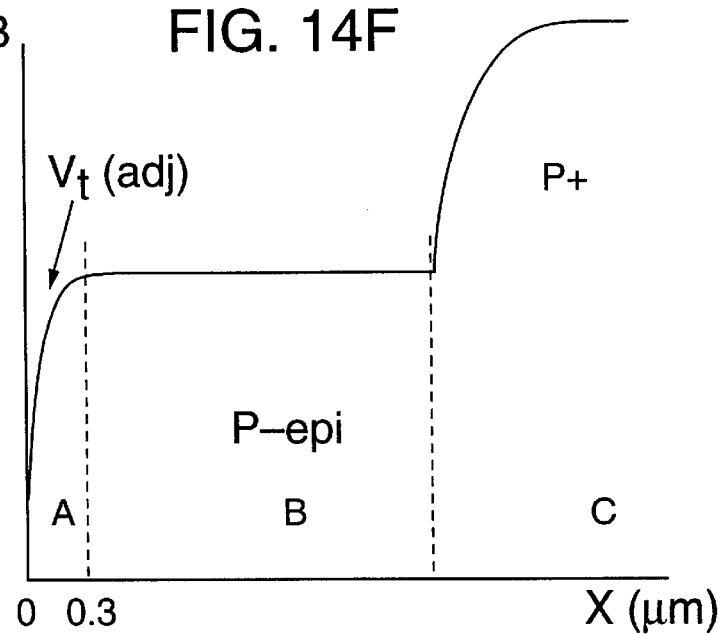
FIG. 14F illustrates a graph showing a dopant concentration profile of the pseudo-Schottky diode of FIG. 14E.

FIG. 14F is a graph showing the dopant concentration $N_B$ of the device taken along a vertical section through the channel of pseudo-Schottky diode 1490 (shown by the dashed line in FIG. 14E). The abscissa of the graph of FIG. 14F is the distance in μm below the surface of the threshold-adjusted channel region. Region A includes the channel, wherein the concentration of P-type dopant has been lowered by the threshold adjust implant so as to lower the threshold voltage $V_t$ and thereby improve the turn-on characteristics of pseudo-Schottky diode 1490. While the profile looks somewhat similar to that of a conventional threshold-adjusted MOSFET, the pseudo-Schottky effect is enhanced by unusual levels of body doping and threshold adjust counterdoping. Region B represents the P-epitaxial layer 1412, and Region C represents the P+ substrate 1410, which has the highest dopant concentration.

Pseudo-Schottky diode 1490 can also be manufactured without the counter-doping implant shown in FIG. 14A, if a high energy implant step, as described in application Ser. No. 07/855,373, now abandoned, and application Ser. No. 07/854,162, now U.S. Pat. No. 5,248,627 is used to drive the dopant through the polysilicon gate. The sensitivity of the device characteristics to the level of epitaxial layer doping can be reduced by performing a second ion implantation (in addition to the counterdoping threshold voltage adjust) of the same conductivity type as the epitaxial layer itself. As shown in FIG. 14G, a retrograde boron implant at a dosage in the range of $1\times10^{12}$ to $5\times10^{14}$ cm$^{-2}$ is implanted at 200 keV or greater to a mean depth of 0.2 to 1.0 μm below the surface of the epitaxial layer, so that less surface counter-doping is needed. The unimplanted portion of the P-epitaxial layer may be thin or nonexistent (the retrograde layer can extend into the substrate. The advantages of using ion implantation to set the value of $N_B$ and γ instead of using the epitaxial layer alone include improved dopant concentration control and the ability to select which MOSFETs in an IC are to be adjusted for pseudo-Schottky enhancement.

Figure 15A:
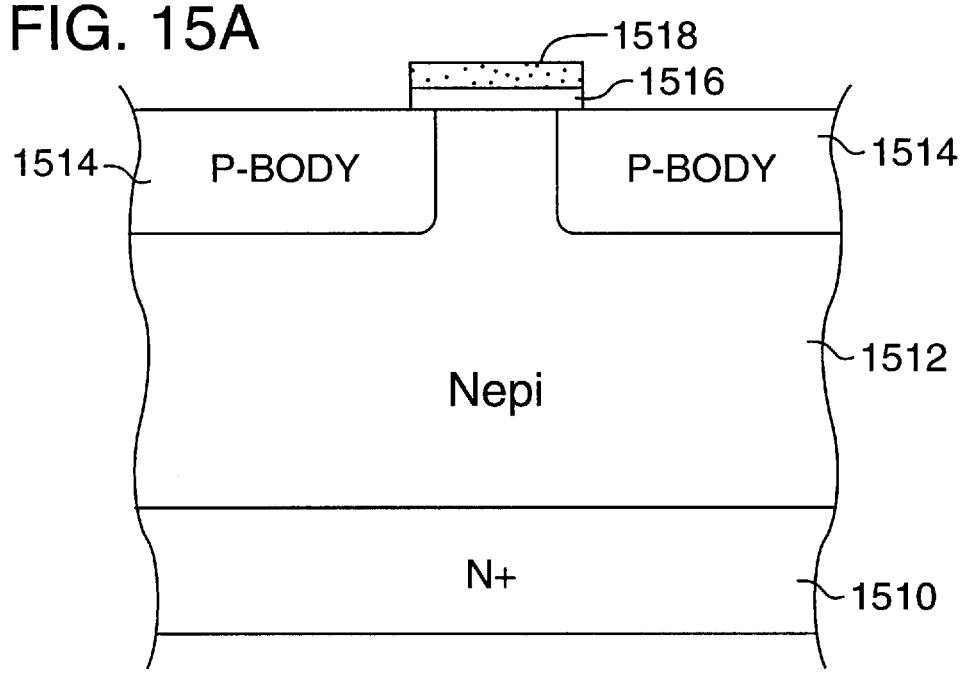
FIGS. 15A–15C illustrate cross-sectional views showing a method of forming an pseudo-Schottky diode based on a vertical DMOSFET.
Figure 15B:
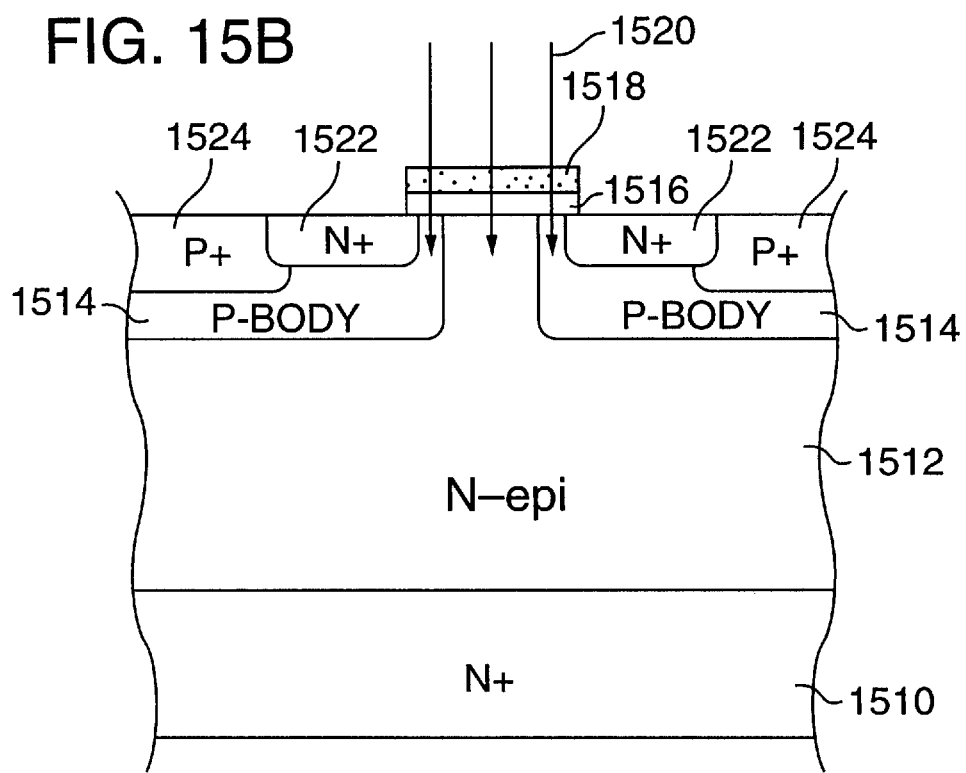
Figure 15C:
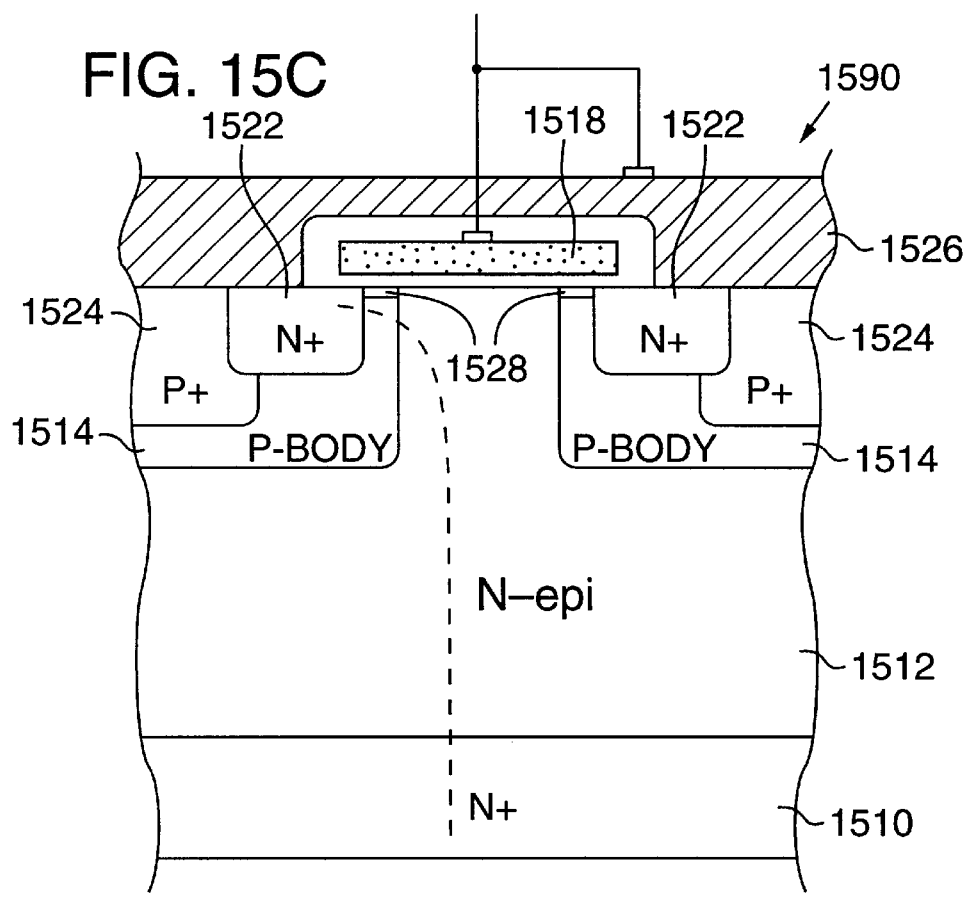

FIGS. 15A–15C show a sequence of manufacturing steps that can be used to obtain an pseudo-Schottky diode based on a vertical DMOSFET. As shown in FIG. 15A, an N-epitaxial layer 1512, is grown on an N+ substrate 1510 which will be the cathode of the device. The doping level of the epitaxial layer is determined by the desired breakdown voltage of the device. For high voltage devices, concentrations of $1\times10^{14}$ to $1\times10^{15}$ cm$^{-3}$ may be used while for lower voltages concentrations $1\times10^{15}$ to $1\times10^{16}$ cm$^{-3}$ may be employed. P-body regions 1514 are formed in N-epitaxial layer 1512 using conventional techniques. A gate oxide layer 1516 and a polysilicon gate 1518 are also formed using conventional techniques of implantation and drive-in.

FIG. 15B shows the addition of N+ source regions 1522 and P+ body contact regions 1524, also formed with conventional techniques. An N-type dopant 1520 (phosphorus) is then implanted at a dosage of $1\times10^{11}$ to $1\times10^{12}$ cm$^{-2}$ and an energy of 300 keV to 2 MeV through gate 1518. Dopant 1520 forms counter-doped threshold adjust regions 1528 (FIG. 15C) at the surface of P-body regions 1514 in order to adjust the threshold voltage of the device. The phosphorous dopant will have little effect on the N-epitaxial layer 1512, since it should be located near the surface. In FIG. 15C the pseudo-Schottky diode 1590 is substantially completed by adding a metal source/body contact layer 1526, which is also connected to gate 1518. These connections would not be made if device were a three-terminal or four-terminal MOSFET instead of a pseudo-Schottky diode.

Figure 15D:
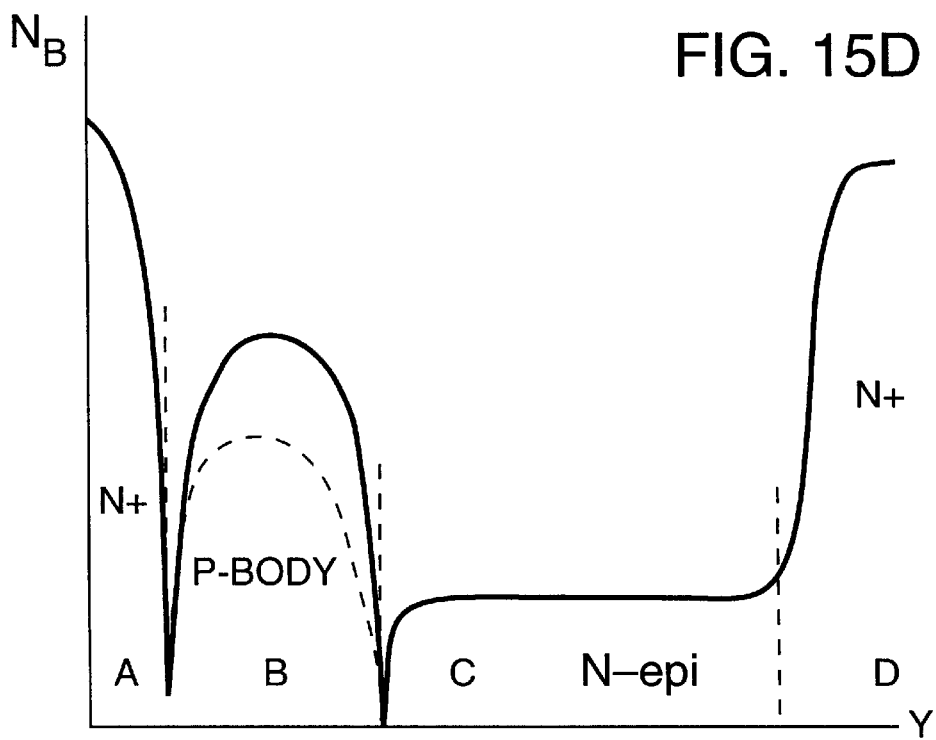
FIG. 15D illustrates a graph showing the dopant concentration profile of the pseudo-Schottky diode of FIG. 15C.

FIG. 15D shows the dopant concentration $N_B$ of the device at a section taken along the dashed line in FIG. 15C. In region A represents the N+ source region 1522. Region B represents P-body region 1514. The concentration near the surface of the body region, shown as a dashed line in FIG. 15D, has been lowered due to the high energy counter-doping to adjust the threshold voltage $V_t$. Region C represents N-epitaxial layer 1512, and Region D represents N+ substrate 1510.

While specific embodiments in accordance with this invention have been described, these embodiments are to be considered as illustrative and not limiting. Numerous alternative embodiments will be apparent to those skilled in the art, all of which are within the broad scope of this invention. For example, the principles of this invention are equally applicable to other MOSFET structures such as lateral DMOS and cellular MOS structures, which have cells in square, hexagonal or other shaped cells, and for either N-channel or P-channel devices.

We claim:

1. A semiconductor device comprising:
   a source region of a first conductivity type;
   a body region of a second conductivity type opposite to said first conductivity type adjacent said source region;
   a drain region of said first conductivity type adjacent said body region; and
   a gate separated by an insulating layer from a channel region of said body region,
   wherein said source region, said body region and said drain region are formed in a semiconductor chip, said gate being positioned in a trench which is formed at a surface of said chip, said source region, said body region and said gate being shorted together and biased at a first voltage and said drain region being biased at a second voltage, said first and second voltages being established such that a junction between said body and said drain is forward-biased.

2. The semiconductor device of claim 1 wherein said source region and said body region are adjacent a top side of said chip and said drain region is adjacent a back side of said chip.

3. The semiconductor device of claim 1 wherein a thickness of said insulating layer is in the range of 400 Å to 1000 Å.

4. A combination including the semiconductor device of claim 1 and a PN diode, said PN diode being connected between said source and drain regions.

5. The combination of claim 4 wherein said diode has an anode and a cathode, wherein said source region is electrically connected with said anode and said drain region is electrically connected with said cathode.

6. The combination of claim 4, said semiconductor device and said PN diode being formed on a single integrated circuit.

7. A combination including the semiconductor device of claim 1 and a transistor, said transistor having a second drain region and a second body region, wherein said source region of said semiconductor device is electrically connected to said second body region and said drain region of said semiconductor device is electrically connected to said second drain region.

8. The combination of claim 7 wherein said semiconductor device and said transistor are formed in said semiconductor chip.

9. A power converter comprising:
   a switch and a diode connected in series;
   an inductor connected to a common node between said switch and said diode; and
   the semiconductor device of claim 1 connected in parallel with said diode.

10. A power converter comprising:
    a first MOSFET of a first conductivity type and a second MOSFET of a second conductivity type opposite to said first conductivity type connected in series;
    an inductor connected to a common node between said first and second MOSFETs; and
    the semiconductor device of claim 1 connected in parallel with said first MOSFET.

11. The power converter of claim 10 further comprising a third MOSFET connected in parallel with said second MOSFET, said third MOSFET having source, body and drain terminals shorted together.

12. A power converter comprising:
    an inductor and a switch connected in series;
    a diode connected to a common node between said switch and said inductor; and
    the semiconductor device of claim 1 connected in parallel with said diode.

13. A current mirror arrangement comprising:
    the semiconductor device of claim 1 connected to a supply voltage; and
    a MOSFET, a gate of said MOSFET being connected to said gate of said semiconductor device.

14. A semiconductor device formed within a transistor comprising:
    a source region of a first conductivity type;
    a body region of a second conductivity type adjacent said source region;
    a drain region of said first conductivity type adjacent said body region;
    a first gate separated by a first insulating layer from a channel region of said body region, and
    a second gate separated by a second insulating layer from a channel region of said body region,
    wherein said source region, said body region and said second gate are shorted together and biased at a first voltage and said drain region is biased at a second voltage, said first and second voltages being established such that a junction between said body and said drain is forward-biased.

* * * * *

UNITED STATES PATENT AND TRADEMARK OFFICE
CERTIFICATE OF CORRECTION

PATENT NO. : 5,818,084
DATED : October 6, 1998
INVENTOR(S) : Richard K. Williams and Robert B. Blattner It is certified that error appears in the above-identified patent and that said Letters Patent is hereby corrected as shown below:

<u>Title page,</u>
Item [56], U.S. PATENT DOCUMENTS, the following is inserted:
-- 5,248,627     9/28/93     Williams     437/45 --

FOREIGN PATENT DOCUMENTS, the following is inserted:
-- 02091974     3/30/90     Japan
WO 93/19482     9/30/93     PCT
WO 94/23457     10/13/94     PCT --

Signed and Sealed this

Eleventh Day of February, 2003

JAMES E. ROGAN
*Director of the United States Patent and Trademark Office*